(12) United States Patent
Ishihara et al.

(10) Patent No.: US 10,153,737 B2
(45) Date of Patent: Dec. 11, 2018

(54) POWER AMPLIFIER MODULE

(71) Applicant: Murata Manufacturing Co., Ltd., Kyoto (JP)

(72) Inventors: Shota Ishihara, Kyoto (JP); Yusuke Shimamune, Kyoto (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 0 days.

(21) Appl. No.: 15/918,414

(22) Filed: Mar. 12, 2018

(65) Prior Publication Data

US 2018/0262165 A1 Sep. 13, 2018

(30) Foreign Application Priority Data

Mar. 13, 2017 (JP) ................. 2017-047445

(51) Int. Cl.
*H03F 1/30* (2006.01)
*H03F 3/21* (2006.01)
*H03F 3/195* (2006.01)
*H03F 3/213* (2006.01)

(52) U.S. Cl.
CPC ............ *H03F 1/30* (2013.01); *H03F 3/195* (2013.01); *H03F 3/211* (2013.01); *H03F 3/213* (2013.01); *H03F 2200/156* (2013.01); *H03F 2200/219* (2013.01); *H03F 2200/451* (2013.01); *H03F 2203/21181* (2013.01)

(58) Field of Classification Search
CPC ....................................................... H03F 1/30
USPC ................................................. 330/296, 285
See application file for complete search history.

(56) References Cited

U.S. PATENT DOCUMENTS

| | | | |
|---|---|---|---|
| 7,944,306 B2* | 5/2011 | Prikhodko | ............ H03F 1/0205 330/133 |
| 9,935,588 B2* | 4/2018 | Ni | ............................. H03F 1/32 |
| 2001/0052820 A1 | 12/2001 | Morizuka | |
| 2002/0186084 A1* | 12/2002 | Liwinski | ................. G05F 3/265 330/296 |
| 2009/0206933 A1* | 8/2009 | Prikhodko | ............ H03F 1/0205 330/285 |
| 2014/0015568 A1 | 1/2014 | Shimamune | |
| 2014/0253243 A1 | 9/2014 | Hagisawa | |
| 2017/0019082 A1 | 1/2017 | Ishihara | |

FOREIGN PATENT DOCUMENTS

| | | |
|---|---|---|
| JP | 2000-013250 A | 1/2000 |
| JP | 2005-020383 A | 1/2005 |
| JP | 2014-171170 A | 9/2014 |
| TW | 494621 B | 7/2002 |
| WO | 2013/031440 A1 | 3/2013 |

* cited by examiner

*Primary Examiner* — Henry Choe
(74) *Attorney, Agent, or Firm* — Pearne & Gordon LLP

(57) ABSTRACT

A power amplifier module includes an amplifier that amplifies an input signal and outputs an amplified signal, an emitter follower transistor that supplies a bias signal to the amplifier to control a bias point of the amplifier, and a current source that supplies a control current which changes in accordance with a change in control voltage to a collector of the emitter follower transistor. The current source limits the control current to not greater than an upper limit.

18 Claims, 32 Drawing Sheets

POWER AMPLIFIER MODULE

This application claims priority from Japanese Patent Application No. 2017-047445 filed on Mar. 13, 2017. The content of this application is incorporated herein by reference in its entirety.

BACKGROUND

The present disclosure relates to a power amplifier module. A mobile communication terminal such as a cellular phone includes a power amplifier that amplifies a radio frequency (RF) signal to be transmitted to a base station. The power amplifier includes an amplifier that amplifies the RF signal, and a bias circuit that controls the bias point of the amplifier. A bias circuit of this type that is disclosed in, for example, Japanese Unexamined Patent Application Publication No. 2014-171170 is known. The disclosed bias circuit includes an emitter follower transistor that supplies a bias signal to an amplifier, and a constant voltage generating circuit for generating a constant voltage to be supplied to the collector of the emitter follower transistor.

When a bipolar transistor in an amplifier is driven with a base-emitter voltage of the bipolar transistor at a fixed voltage, a collector current increases in accordance with an increase in temperature. The increase in collector current causes an increase in power consumption, which increases the temperature of the bipolar transistor. Accordingly, the collector current further increases. That is, thermal runaway occurs. In a circuit configuration of the related art in which a constant voltage is supplied to the collector of an emitter follower transistor that supplies a bias signal to an amplifier, it is difficult to suppress the increase in collector current caused by thermal runaway, which may destroy the amplifier.

In addition, if the output of the RF signal exceeds the withstand voltage of an antenna switch due to factors such as fluctuations in battery voltage, fluctuations in output load, or fluctuations in temperature, a power drop may occur. The occurrence of a power drop is due to leakage of current from a field-effect transistor in the antenna switch.

BRIEF SUMMARY

Accordingly, the present disclosure appropriately limits the output of an amplifier.

According to embodiments of the present disclosure, a power amplifier module includes (i) an amplifier that amplifies an input signal and outputs an amplified signal, (ii) an emitter follower transistor that supplies a bias signal to the amplifier to control a bias point of the amplifier, and (iii) a current source that supplies a control current which changes in accordance with a change in control voltage to a collector of the emitter follower transistor. The current source limits the control current to not greater than an upper limit.

According to embodiments of the present disclosure, a power amplifier module can appropriately limit the output of an amplifier.

Other features, elements, and characteristics of the present disclosure will become more apparent from the following detailed description of embodiments of the present disclosure with reference to the attached drawings.

DETAILED DESCRIPTION

Embodiments of the present disclosure will be described hereinafter with reference to the drawings. The same or substantially the same circuit elements are represented by the same numerals and are not repeatedly described.

Figure 1:
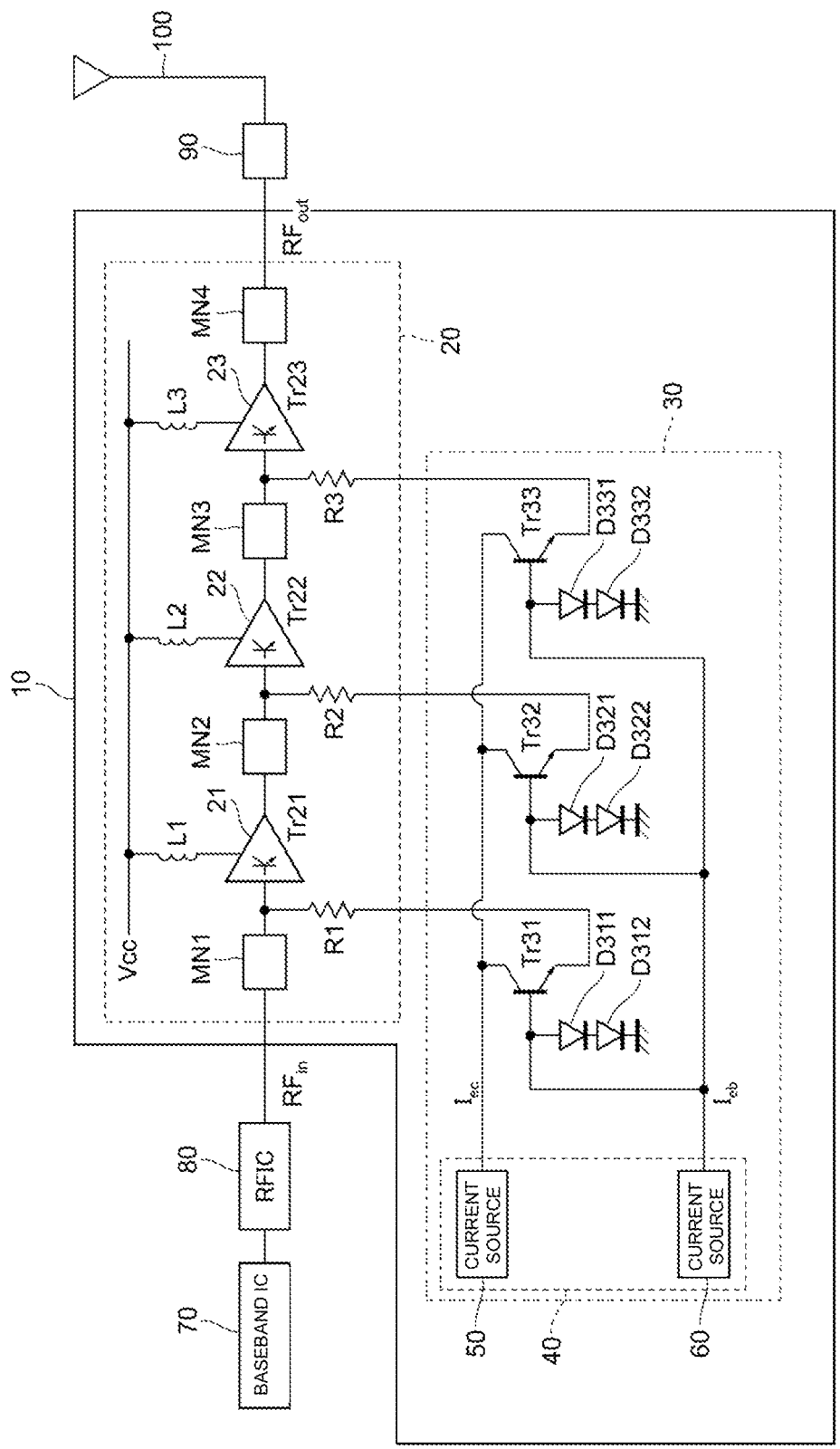
FIG. 1 is a circuit diagram of a power amplifier module according to a first embodiment of the present disclosure.

FIG. 1 is a circuit diagram of a power amplifier module 10 according to a first embodiment of the present disclosure. The power amplifier module 10, which is incorporated in a mobile communication terminal such as a cellular phone, amplifies the power of an input signal $RF_{in}$ to a level necessary for transmission to a base station and outputs an amplified signal $RF_{out}$. The input signal $RF_{in}$ is an RF signal that is modulated in accordance with a predetermined communication scheme. The power amplifier module 10 includes an amplifier circuit 20 and a bias circuit 30. The amplifier circuit 20 includes a plurality of amplifiers 21, 22, and 23 that are connected in multiple stages.

A baseband integrated circuit (IC) 70 performs coding and modulation of communication information in accordance with a predetermined communication scheme, followed by digital signal processing, to generate a baseband signal. A radio frequency integrated circuit (RFIC) 80 modulates a carrier wave in accordance with information superimposed on the baseband signal to generate the input signal $RF_{in}$.

The amplifier 21 amplifies the input signal $RF_{in}$ and outputs an amplified signal. The amplifier 22 further amplifies the amplified signal output from the amplifier 21 and outputs an amplified signal. The amplifier 23 further amplifies the amplified signal output from the amplifier 22 and outputs the amplified signal $RF_{out}$. Matching networks MN1, MN2, MN3, and MN4 are respectively disposed between the output of the RFIC 80 and the input of the amplifier 21, between the output of the amplifier 21 and the input of the amplifier 22, between the output of the amplifier 22 and the input of the amplifier 23, and between the output of the amplifier 23 and an antenna switch 90. The matching networks MN1, MN2, MN3, and MN4 are each configured to perform impedance matching between the preceding circuit and the subsequent circuit. The amplified signal $RF_{out}$ is transmitted from an antenna 100 through the antenna switch 90. In the example illustrated in FIG. 1, the amplifiers 21, 22, and 23 are connected in three stages. The number of stages in which amplifiers are connected may be determined as appropriate in accordance with the output level of the amplified signal $RF_{out}$. In time-division multiplexing, the antenna switch 90 is used to switch between transmission and reception. The amplifier circuit 20 may further include a plurality of parallel-connected amplifiers. In this case, the antenna switch 90 routes an amplified signal from any one amplifier selected from among the plurality of parallel-connected amplifiers to the antenna 100.

The amplifier 21 includes a common-emitter transistor Tr21, for example. The input signal $RF_{in}$ is supplied to the base of the transistor Tr21, and an amplified signal is output from the collector of the transistor Tr21. Further, the collector of the transistor Tr21 is connected to a power supply voltage Vcc via an inductor element L1. Like the amplifier 21, the amplifier 22 includes a common-emitter transistor Tr22. The amplified signal from the transistor Tr21 is supplied to the base of the transistor Tr22, and an amplified signal obtained by further amplifying the supplied amplified signal is output from the collector of the transistor Tr22. Further, the collector of the transistor Tr22 is connected to the power supply voltage Vcc via an inductor element L2. Like the amplifiers 21 and 22, the amplifier 23 includes a common-emitter transistor Tr23. The amplified signal from the transistor Tr22 is supplied to the base of the transistor Tr23, and the amplified signal $RF_{out}$, which is obtained by further amplifying the supplied amplified signal, is output from the collector of the transistor Tr23. Further, the collector of the transistor Tr23 is connected to the power supply voltage Vcc via an inductor element L3. The transistors Tr21, Tr22, and Tr23 are, for example, heterojunction bipolar transistors. Alternatively, the amplifiers 21, 22, and 23 may have a multi-finger structure with a plurality of fingers (unit transistors) connected in parallel, each finger being one of the transistors Tr21, Tr22, and Tr23.

The bias circuit 30 includes a plurality of emitter follower transistors Tr31, Tr32, and Tr33 and a control IC 40. The control IC 40 includes current sources 50 and 60. The current source 50 supplies a control current $I_{ec}$, which changes in accordance with a change in control voltage, to the respective collectors of the emitter follower transistors Tr31, Tr32, and Tr33. The control voltage is used to control the signal level of the amplified signal $RF_{out}$ and is also referred to as a level control voltage. In this embodiment, examples of the control voltage include a constant voltage and a ramp voltage. The current source 50 generates the control current $I_{ec}$ that changes in accordance with a change in any one control voltage selected from among a constant voltage and a ramp voltage in accordance with the communication scheme, for example, and outputs the control current $I_{ec}$. The constant voltage has a voltage waveform whose voltage value does not change with time and is fixed. The ramp voltage has, for example, a voltage waveform whose voltage value linearly increases with time (such as a triangular waveform or a trapezoidal waveform). The current source 50 limits the control current $I_{ec}$ to not greater than an upper limit. The upper limit is not fixed but is variable in accordance with the level of the control voltage. The current source 60 supplies a constant current $I_{eb}$ to the respective bases of the emitter follower transistors Tr31, Tr32, and Tr33. The control current $I_{ec}$ supplied from the current source 50 and the constant current $I_{eb}$ supplied from the current source 60 are controlled independently. When the current sources 50 and 60 are individually identified, the former current source is sometimes referred to as a first current source and the latter current source is sometimes referred to as a second current source. The control IC 40 may include, instead of the current source 60, a constant voltage source for supplying a constant voltage to the respective bases of the emitter follower transistors Tr31, Tr32, and Tr33 (this also applies to second to fourth embodiments described below).

The emitter of the emitter follower transistor Tr31 supplies a bias signal for controlling the bias point (operating point) of the amplifier 21 to the amplifier 21 via a base ballast resistance element R1. The bias signal is supplied to the base of the transistor Tr21. Likewise, the emitter of the emitter follower transistor Tr32 supplies a bias signal for controlling the bias point of the amplifier 22 to the amplifier 22 via a base ballast resistance element R2. The bias signal is supplied to the base of the transistor Tr22. Likewise, the emitter of the emitter follower transistor Tr33 supplies a bias signal for controlling the bias point of the amplifier 23 to the amplifier 23 via a base ballast resistance element R3. The bias signal is supplied to the base of the transistor Tr23. The term "bias signal" refers to a bias current or a bias voltage.

When the transistor Tr21 is driven with a base-emitter voltage thereof fixed, a collector current increases in accordance with an increase in temperature. The increase in collector current causes an increase in power consumption, which increases the temperature of the bipolar transistor Tr21. Accordingly, the collector current further increases. That is, positive feedback (thermal runaway) occurs. In contrast, diodes D311 and D312 are connected in series between the base of the emitter follower transistor Tr31 and ground. Since the diodes D311 and D312 have temperature characteristics in which the forward voltages of the diodes D311 and D312 decrease in accordance with an increase in temperature, the base potential of the emitter follower transistor Tr31 decreases in accordance with an increase in temperature. Thus, the thermal runaway of the transistor Tr21 can be prevented or reduced. Also, due to the temperature characteristics of diodes D321 and D322 connected in series between the base of the emitter follower transistor Tr32 and ground, the base potential of the emitter follower transistor Tr32 decreases in accordance with an increase in temperature. Thus, the thermal runaway of the transistor Tr22 can be prevented or reduced. Also, due to the temperature characteristics of diodes D331 and D332 connected in series between the base of the emitter follower transistor Tr33 and ground, the base potential of the emitter follower transistor Tr33 decreases in accordance with an increase in temperature. Thus, the thermal runaway of the transistor Tr23 can be prevented or reduced.

Figure 2:
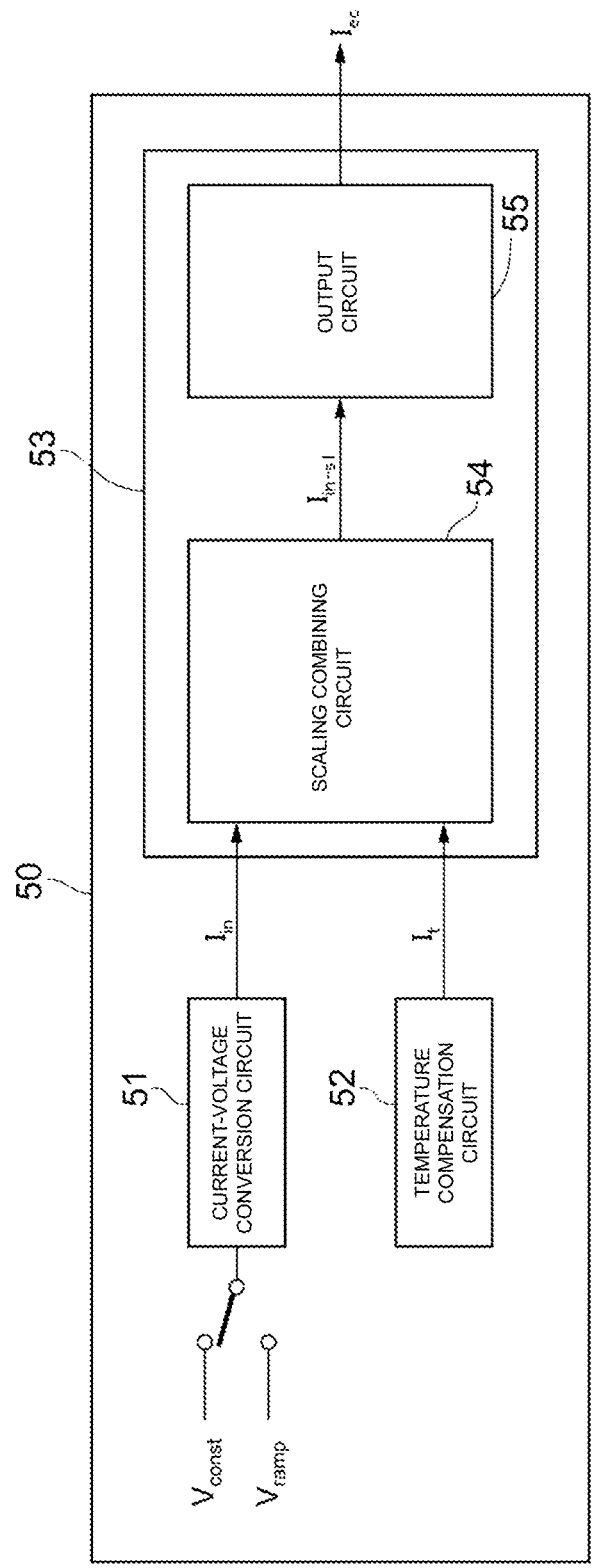
FIG. 2 is a circuit diagram of a current source according to the first embodiment of the present disclosure.

FIG. 2 is a circuit diagram of the current source 50 according to the first embodiment. The current source 50 has a temperature compensation function to suppress a change in the control current $I_{ec}$ with temperature. The current source 50 includes a voltage-current conversion circuit 51, a temperature compensation circuit 52, and a combining circuit 53. The voltage-current conversion circuit 51 converts any one control voltage selected from a constant voltage $V_{const}$ and a ramp voltage $V_{ramp}$ into a temperature-independent current $I_{in}$. The temperature compensation circuit 52 generates a temperature-dependent current $I_t$ for compensating for a change in the control current $I_{ec}$ with temperature. The combining circuit 53 generates the control current $I_{ec}$ from the temperature-independent current $I_{in}$ and the temperature-dependent current $I_t$ and outputs the control current $I_{ec}$. The combining circuit 53 includes a scaling combining circuit 54 and an output circuit 55. The scaling combining circuit 54 generates a current $I_{in\text{-}s1}$ which is obtained through scaling combining, from the temperature-independent current $I_{in}$ and the temperature-dependent current $I_t$. The output circuit 55 generates the control current $I_{ec}$ from the current $I_{in\text{-}s1}$ and outputs the control current $I_{ec}$.

Figure 3:
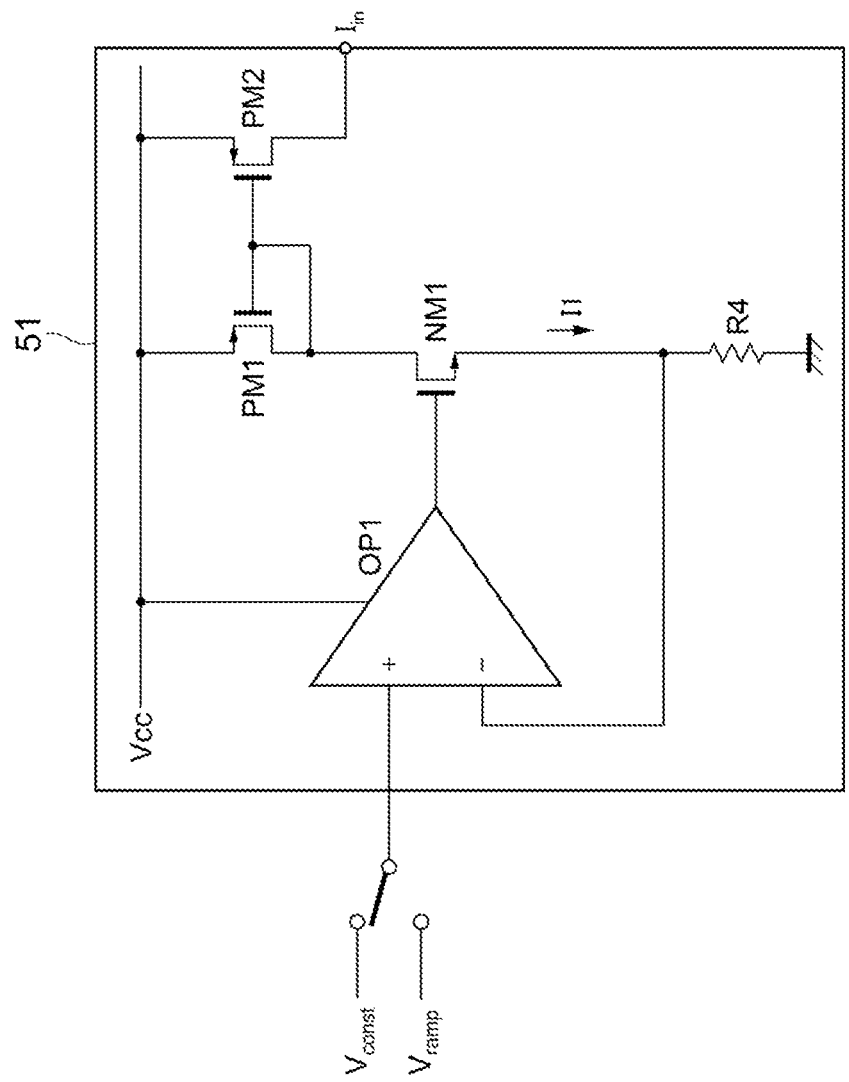
FIG. 3 is a circuit diagram of a voltage-current conversion circuit according to the first embodiment of the present disclosure.

FIG. 3 is a circuit diagram of the voltage-current conversion circuit 51 according to the first embodiment. The voltage-current conversion circuit 51 includes an operational amplifier OP1, an n-channel field-effect transistor NM1, p-channel field-effect transistors PM1 and PM2, and a resistance element R4. Any one control voltage selected from the constant voltage $V_{const}$ and the ramp voltage $V_{ramp}$ is input to a non-inverting input terminal of the operational amplifier OP1. An output terminal of the operational amplifier OP1 is connected to the gate of the n-channel field-effect transistor NM1. An inverting input terminal of the operational amplifier OP1 is connected to the source of the n-channel field-effect transistor NM1. The resistance element R4 is connected between ground and a node between the source of the n-channel field-effect transistor NM1 and the inverting input terminal of the operational amplifier OP1. The source of the p-channel field-effect transistor PM1 is connected to the power supply voltage Vcc, and the drain of the p-channel field-effect transistor PM1 is connected to the drain of the n-channel field-effect transistor NM1. The drain of the p-channel field-effect transistor PM1 is connected to the gate of the p-channel field-effect transistor PM1. The source of the p-channel field-effect transistor PM2 is connected to the power supply voltage Vcc, and the gate of the p-channel field-effect transistor PM2 is connected to the gate of the p-channel field-effect transistor PM1. When the current flowing through the p-channel field-effect transistor PM1, the n-channel field-effect transistor NM1, and the resistance element R4 is represented by I1, the current I1 is equal to a value obtained by dividing the control voltage by the resistance value of the resistance element R4. The temperature-independent current $I_{in}$, which is proportional to the current I1, flows between the drain and source of the p-channel field-effect transistor PM2. The temperature-independent current $I_{in}$ is a temperature-independent current having no temperature characteristic and is proportional to the control voltage. Thus, when the constant voltage $V_{const}$ is selected as a control voltage, no fluctuations in the control voltage occur and a fixed voltage (the upper limit) is input to the non-inverting input terminal of the operational amplifier OP1. The upper limit of the temperature-independent current $I_{in}$ is set accordingly, which enables the control current $I_{ec}$ supplied from the current source 50 to be limited to not greater than the upper limit.

Figure 4:
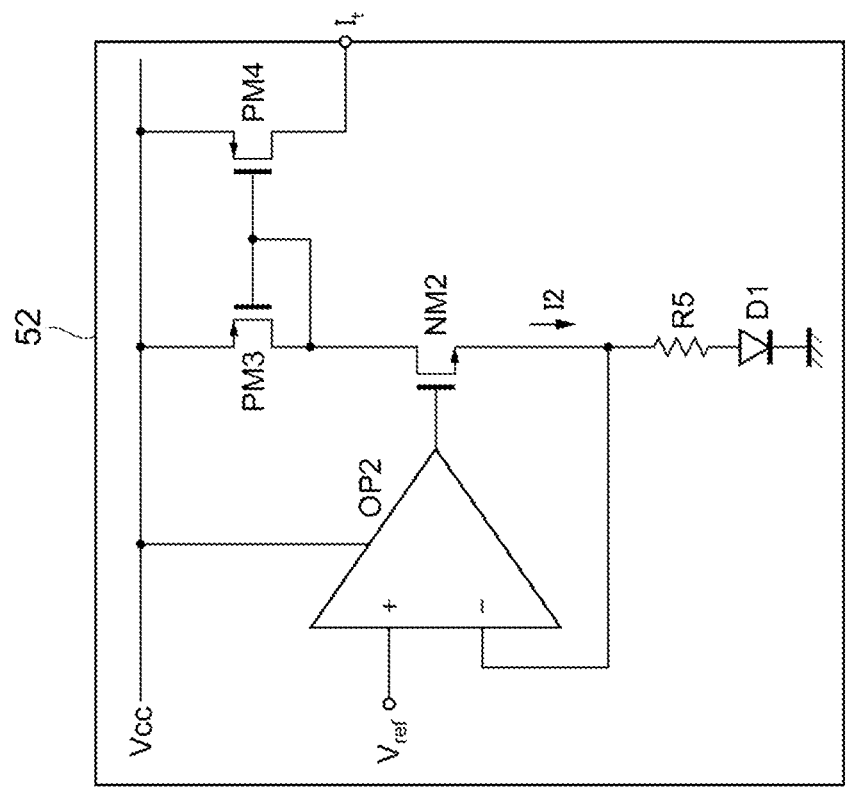
FIG. 4 is a circuit diagram of a temperature compensation circuit according to the first embodiment of the present disclosure.

FIG. 4 is a circuit diagram of the temperature compensation circuit 52 according to the first embodiment. The temperature compensation circuit 52 includes an operational amplifier OP2, an n-channel field-effect transistor NM2, p-channel field-effect transistors PM3 and PM4, a resistance element R5, and a diode D1. A fixed voltage $V_{ref}$ is supplied to a non-inverting input terminal of the operational amplifier OP2. An output terminal of the operational amplifier OP2 is connected to the gate of the n-channel field-effect transistor NM2. An inverting input terminal of the operational amplifier OP2 is connected to the source of the n-channel field-effect transistor NM2. The resistance element R5 and the diode D1 are connected in series between ground and a node between the source of the n-channel field-effect transistor NM2 and the inverting input terminal of the operational amplifier OP2. The source of the p-channel field-effect transistor PM3 is connected to the power supply voltage Vcc, and the drain of the p-channel field-effect transistor PM3 is connected to the drain of the n-channel field-effect transistor NM2. The drain of the p-channel field-effect transistor PM3 is connected to the gate of the p-channel field-effect transistor PM3. The source of the p-channel field-effect transistor PM4 is connected to the power supply voltage Vcc, and the gate of the p-channel field-effect transistor PM4 is connected to the gate of the p-channel field-effect transistor PM3. When the current flowing through the p-channel field-effect transistor PM3, the n-channel field-effect transistor NM2, the resistance element R5, and the diode D1 is represented by I2, the current I2 has a positive temperature characteristic in which the current I2 changes in accordance with the temperature characteristics of the diode D1. It is desirable to adjust the gate widths of the p-channel field-effect transistors PM3 and PM4 and the resistance value of the resistance element R5 such that the diode D1 has substantially the same temperature characteristics as, for example, the diodes D311, D312, D321, D322, D331, and D332 illustrated in FIG. 1. The temperature-dependent current $I_t$, which is proportional to the current I2, flows between the drain and source of the p-channel field-effect transistor PM4. The temperature-dependent current $I_t$ is a current having temperature dependence for compensating for a change in the control current $I_{ec}$ with temperature.

Figure 5:
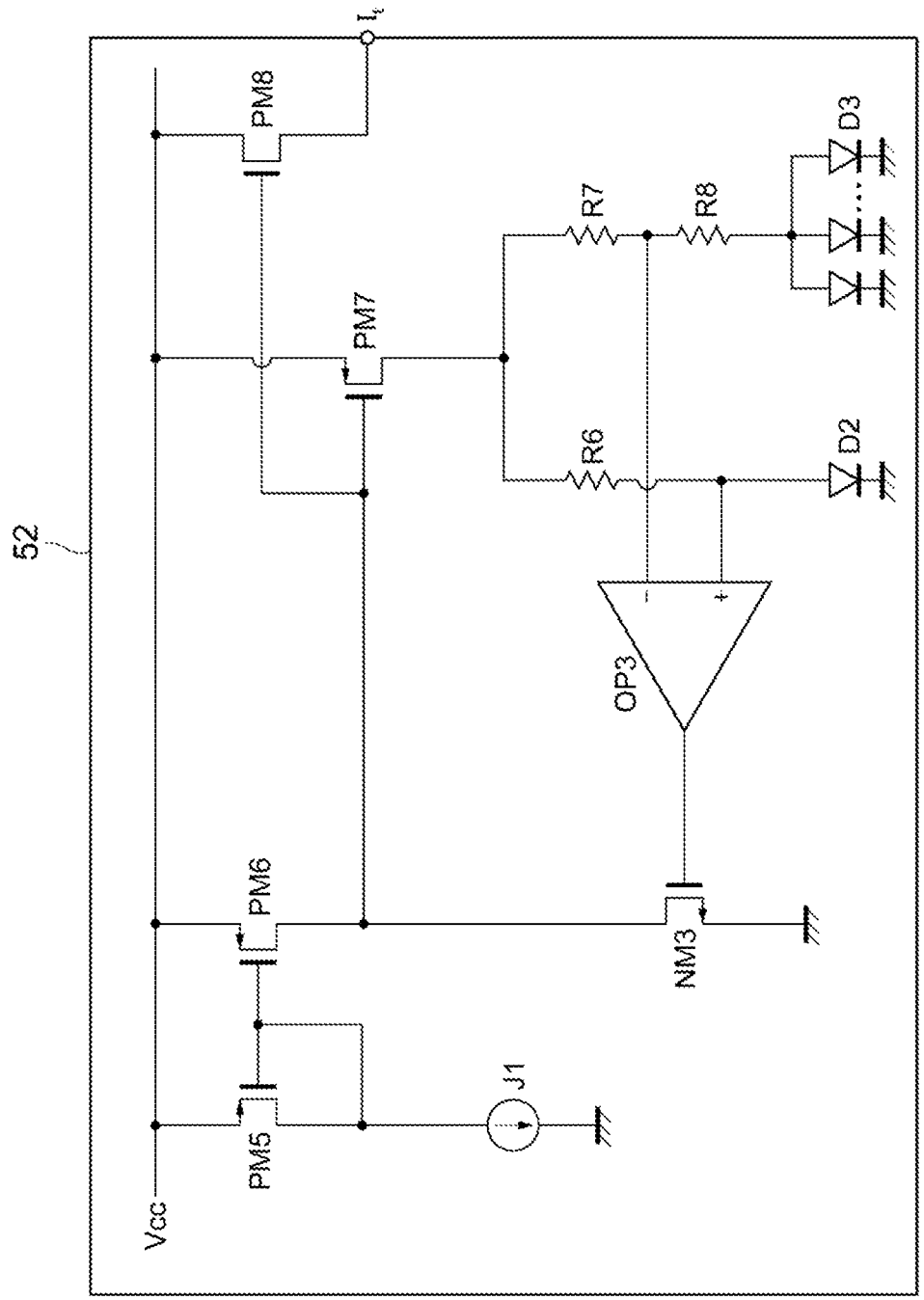
FIG. 5 is a circuit diagram illustrating an alternative example of the temperature compensation circuit according to the first embodiment of the present disclosure.

FIG. 5 is a circuit diagram illustrating an alternative example of the temperature compensation circuit 52 according to the first embodiment. The temperature compensation circuit 52 may include the circuit configuration illustrated in FIG. 5, for example, instead of the circuit configuration illustrated in FIG. 4. The temperature compensation circuit 52 includes a constant current source J1, an operational amplifier OP3, an n-channel field-effect transistor NM3, p-channel field-effect transistors PM5, PM6, PM7, and PM8, resistance elements R6, R7, and R8, and diodes D2 and D3. The p-channel field-effect transistors PM5 and PM6 are connected in a current mirror configuration. The source of the p-channel field-effect transistor PM5 is connected to the power supply voltage Vcc. A constant current supplied from the constant current source J1 flows between the drain and source of the p-channel field-effect transistor PM5. The source of the p-channel field-effect transistor PM6 is connected to the power supply voltage Vcc, and the drain of the p-channel field-effect transistor PM6 is connected to the drain of the n-channel field-effect transistor NM3. The gate of the n-channel field-effect transistor NM3 is connected to an output terminal of the operational amplifier OP3, and the source of the n-channel field-effect transistor NM3 is connected to ground.

The source of the p-channel field-effect transistor PM7 is connected to the power supply voltage Vcc, and the gate of the p-channel field-effect transistor PM7 is connected to the drain of the p-channel field-effect transistor PM6. Likewise, the source of the p-channel field-effect transistor PM8 is connected to the power supply voltage Vcc, and the gate of the p-channel field-effect transistor PM8 is connected to the drain of the p-channel field-effect transistor PM6.

The diode D2 is connected between a non-inverting input terminal of the operational amplifier OP3 and ground, and the resistance element R6 is connected between the non-inverting input terminal of the operational amplifier OP3 and the drain of the p-channel field-effect transistor PM7. The resistance element R8 and the plurality of parallel-connected diodes D3 are connected in series between an inverting input terminal of the operational amplifier OP3 and ground. The resistance element R7 is connected between the inverting input terminal of the operational amplifier OP3 and the drain of the p-channel field-effect transistor PM7.

A voltage reflecting the temperature characteristics of the diode D2 is input to the non-inverting input terminal of the operational amplifier OP3, and a voltage reflecting the temperature characteristics of the plurality of diodes D3 is input to the inverting input terminal of the operational amplifier OP3. Adjusting the respective resistance values of the resistance elements R6, R7, and R8 enables the temperature-dependent current $I_t$ output from the drain of the p-channel field-effect transistor PM8 to have positive temperature characteristics. The temperature-dependent current $I_t$ is a current having temperature dependence for compensating for a change in the control current $I_{ec}$ with temperature.

Figure 6:
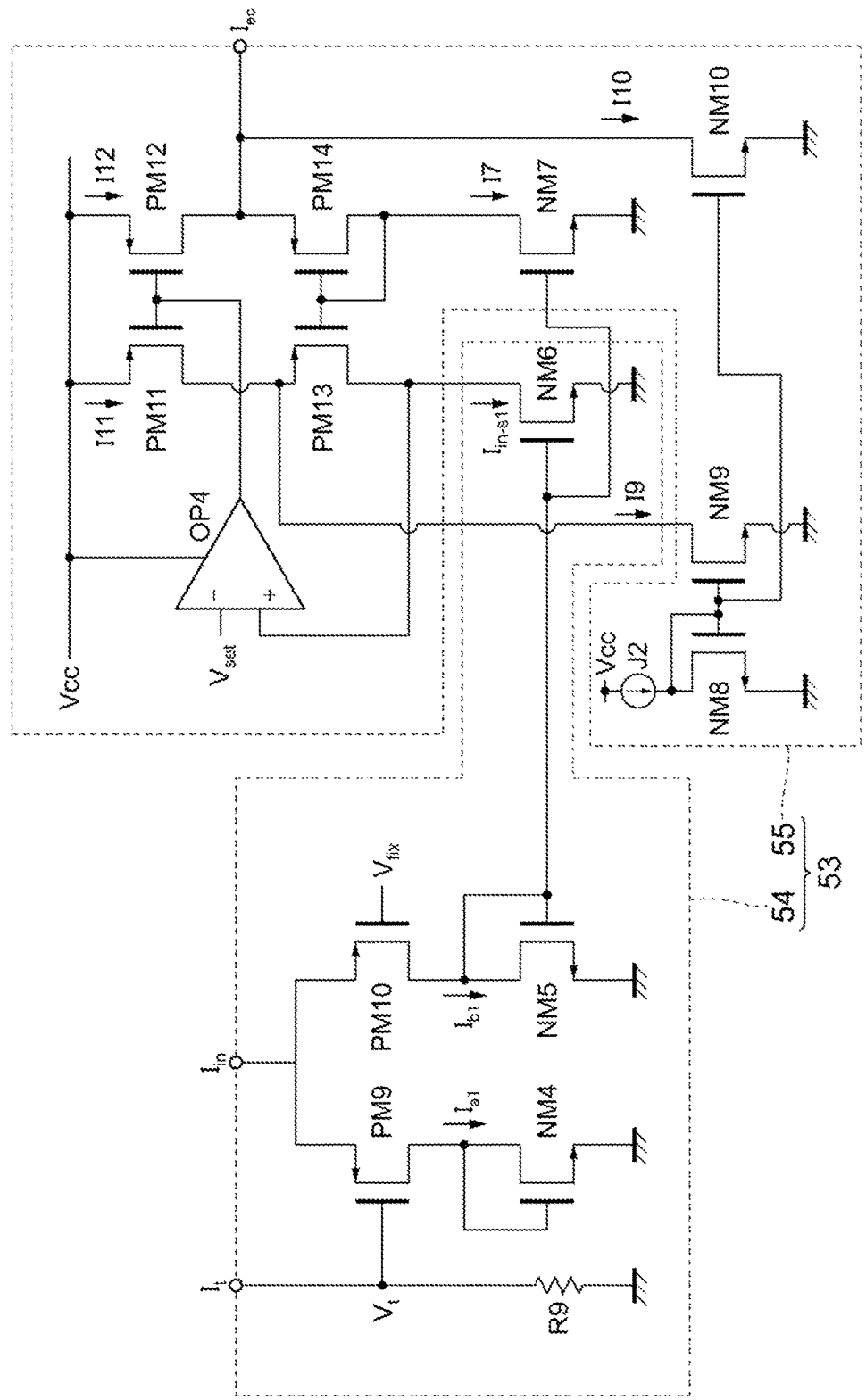
FIG. 6 is a circuit diagram of a combining circuit according to the first embodiment of the present disclosure.

FIG. 6 is a circuit diagram of the combining circuit 53 according to the first embodiment. The combining circuit 53 includes the scaling combining circuit 54 and the output circuit 55. The scaling combining circuit 54 includes n-channel field-effect transistors NM4, NM5, and NM6, p-channel field-effect transistors PM9 and PM10, and a resistance element R9. The respective sources of the p-channel field-effect transistors PM9 and PM10 are connected to each other, and the temperature-independent current $I_{in}$ is supplied to a node between the sources of the p-channel field-effect transistors PM9 and PM10. A voltage $V_t$ is supplied to the gate of the p-channel field-effect transistor PM9. The voltage $V_t$ is a temperature-dependent voltage equal to the voltage across the resistance element R9 through which the temperature-dependent current $I_t$ flows. The drain of the p-channel field-effect transistor PM9 is connected to the drain of the n-channel field-effect transistor NM4. The gate of the n-channel field-effect transistor NM4 is connected to the drain of the n-channel field-effect transistor NM4, and the source of the n-channel field-effect transistor NM4 is connected to ground. A voltage $V_{fix}$ is supplied to the gate of the p-channel field-effect transistor PM10. The drain of the p-channel field-effect transistor PM10 is connected to the drain of the n-channel field-effect transistor NM5. The gate of the n-channel field-effect transistor NM5 is connected to the drain of the n-channel field-effect transistor NM5, and the source of the n-channel field-effect transistor NM5 is connected to ground. The n-channel field-effect transistors NM5 and NM6 are connected in a current mirror configuration.

Figure 7:
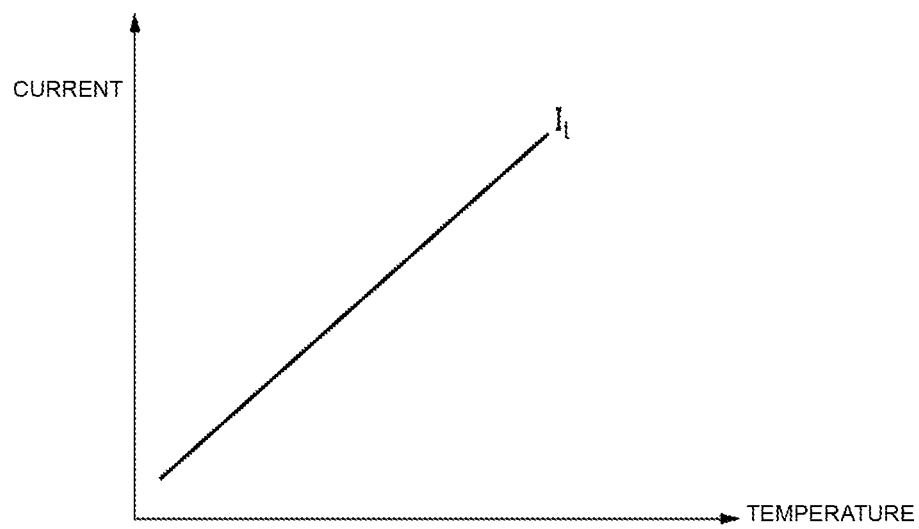
FIG. 7 is graph depicting a change in temperature-dependent current with temperature according to the first embodiment of the present disclosure.
Figure 8:
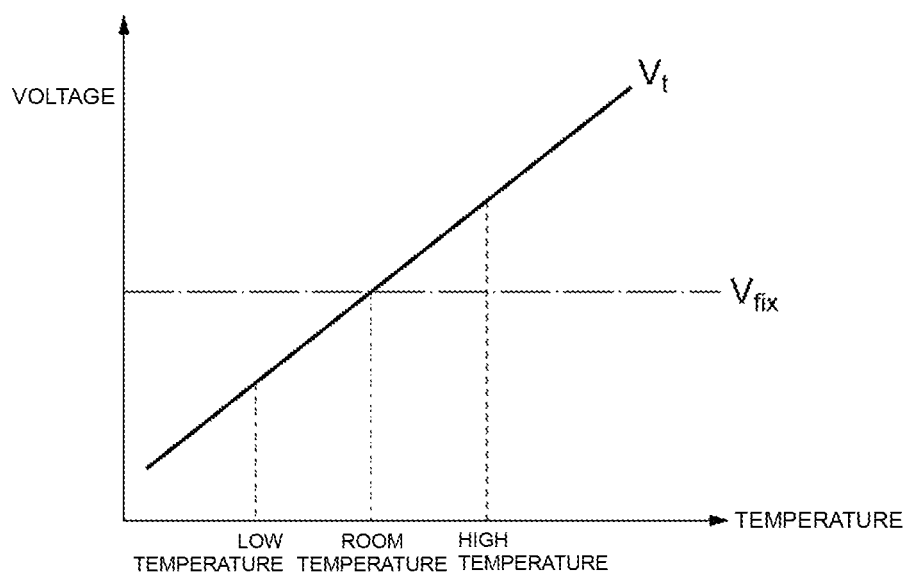
FIG. 8 is a graph depicting changes in a temperature-dependent voltage and a voltage with temperature according to the first embodiment of the present disclosure.
Figure 9:
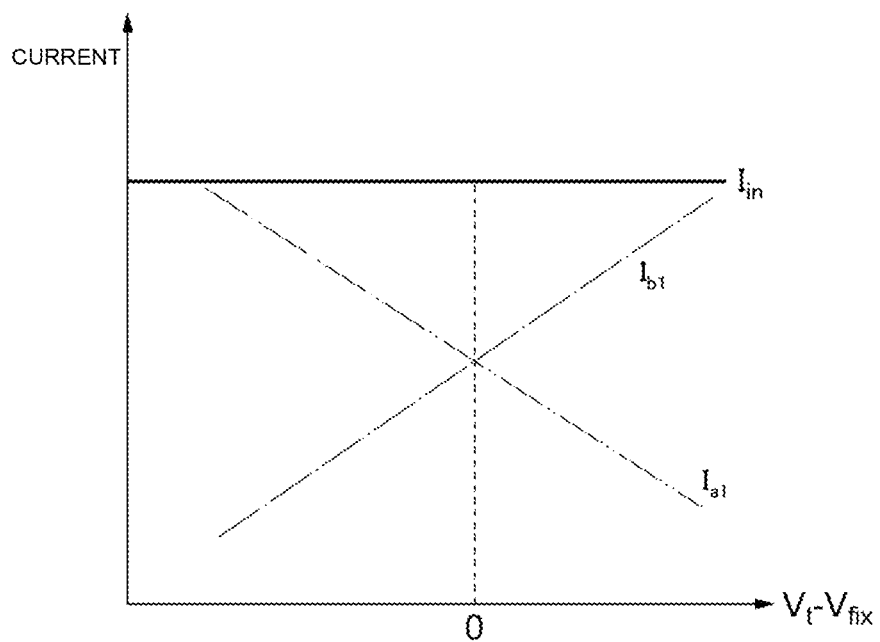
FIG. 9 is a graph depicting a relationship between a current and a voltage difference according to the first embodiment of the present disclosure.
Figure 10:
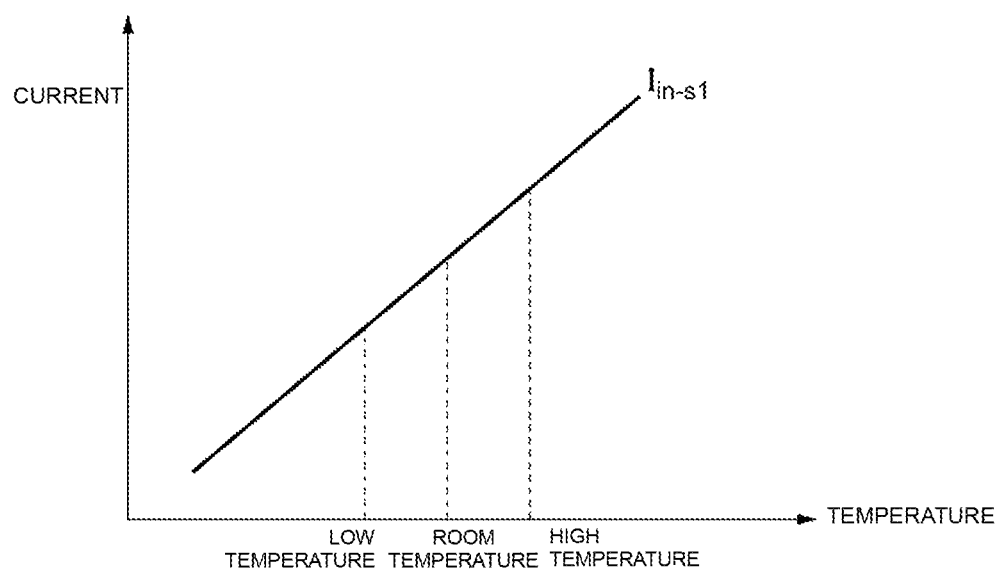
FIG. 10 is a graph depicting a change in current obtained through scaling combining with temperature according to the first embodiment of the present disclosure.
Figure 11:
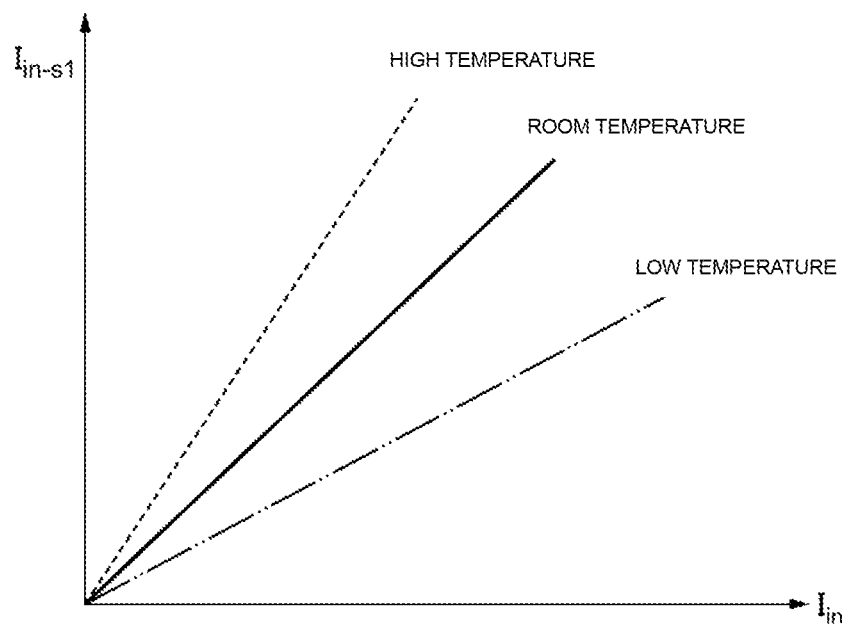
FIG. 11 is a graph depicting relationships between the current obtained through scaling combining and a temperature-independent current according to the first embodiment of the present disclosure.

The temperature-dependent current $I_t$ flowing through the resistance element R9 has a positive temperature characteristic in which the value of the current $I_t$ increases with a temperature increase (see FIG. 7). Since the amount of change in the temperature-dependent current $I_t$ with a temperature change is constant, the temperature-dependent current $I_t$ has a one-dimensional (linear) change characteristic. Accordingly, the voltage $V_t$ supplied to the gate of the p-channel field-effect transistor PM9 has a positive temperature characteristic in which the value of the voltage $V_t$ increases with a temperature increase (see FIG. 8). In contrast, the voltage $V_{fix}$ supplied to the gate of the p-channel field-effect transistor PM10 is a fixed voltage having no temperature independence (see FIG. 8). The voltage $V_t$ and the voltage $V_{fix}$ are equal to each other at a room temperature (for example, 25° C.). The voltage $V_t$ is larger than the voltage $V_{fix}$ at temperatures higher than the room temperature, and the voltage $V_t$ is smaller than the voltage $V_{fix}$ at temperatures lower than the room temperature. The current flowing through the respective channels of the p-channel field-effect transistor PM9 and the n-channel field-effect transistor NM4 is represented by $I_{a1}$. The current flowing through the respective channels of the p-channel field-effect transistor PM10 and the n-channel field-effect transistor NM5 is represented by $I_{b1}$. In this case, the relationship $I_{in}=(I_{a1}+I_{b1})$ holds. The current $I_{b1}$ is proportional to the difference between the voltage $V_t$ and the voltage $V_{fix}$ ($V_t-V_{fix}$) (see FIG. 9). The current $I_{in-s1}$ flowing between the drain and source of the n-channel field-effect transistor NM6 is proportional to the current $I_{b1}$. In this way, the current $I_{in-s1}$ obtained through scaling combining can be generated from the temperature-independent current $I_{in}$ and the temperature-dependent current $I_t$. The current $I_{in-s1}$ has a positive temperature characteristic in which the value of the current $I_{in-s1}$ increases with a temperature increase (see FIG. 10). Plotting the value of the temperature-independent current $I_{in}$ on the x-axis and the value of the current $I_{in-s1}$ on the y-axis of a graph yields lines as illustrated in FIG. 11. The line on the graph at temperatures lower than the room temperature has a gentle slope, whereas the line on the graph at temperatures higher than the room temperature has a steep slope. In scaling combining, all the lines on the graph pass through the origin, and the slopes of the lines on the graph are controlled in accordance with temperature. The slopes of the lines on the graph illustrated in FIG. 11 represent the ratio of the current $I_{in-s1}$ to the temperature-independent current $I_{in}$. In scaling combining, in this way, the ratio of the current $I_{in-s1}$ to the temperature-independent current $I_{in}$ is adjusted in accordance with temperature. When the ratio of the current $I_{in-s1}$ to the temperature-independent current $I_{in}$ is referred to as a correction coefficient, the scaling combining circuit 54 has a function of generating the current $I_{in-s1}$ by multiplying the temperature-independent current $I_{in}$ by the correction coefficient corresponding to the temperature.

Referring back to FIG. 6, the output circuit 55 includes a constant current source J2, an operational amplifier OP4, n-channel field-effect transistors NM7, NM8, NM9, and NM10, and p-channel field-effect transistors PM11, PM12, PM13, and PM14. A voltage $V_{set}$ is supplied to an inverting input terminal of the operational amplifier OP4. A non-inverting input terminal of the operational amplifier OP4 is connected to the drain of the p-channel field-effect transistor PM13, and an output terminal of the operational amplifier OP4 is connected to the gate of the p-channel field-effect transistor PM11. The source of the p-channel field-effect transistor PM11 is connected to the power supply voltage Vcc, and the drain of the p-channel field-effect transistor PM11 is connected to the source of the p-channel field-effect transistor PM13. The source of the p-channel field-effect transistor PM12 is connected to the power supply voltage Vcc, and the drain of the p-channel field-effect transistor PM12 is connected to the source of the p-channel field-effect transistor PM14. The gate of the p-channel field-effect transistor PM11 is connected to the gate of the p-channel field-effect transistor PM12. The gate of the p-channel field-effect transistor PM13 is connected to the gate of the p-channel field-effect transistor PM14. The gate of the p-channel field-effect transistor PM14 is connected to the drain of the p-channel field-effect transistor PM14.

The respective gates of the n-channel field-effect transistors NM6 and NM7 are connected to the gate of the n-channel field-effect transistor NM5. The drain of the n-channel field-effect transistor NM6 is connected to the drain of the p-channel field-effect transistor PM13. The drain of the n-channel field-effect transistor NM7 is connected to the drain of the p-channel field-effect transistor PM14. The respective sources of the n-channel field-effect transistors NM6 and NM7 are connected to ground.

A constant current is supplied to the drain of the n-channel field-effect transistor NM8 from the constant current source J2 connected to the power supply voltage Vcc. The gate of the n-channel field-effect transistor NM8 is connected to the drain of the n-channel field-effect transistor NM8. The source of the n-channel field-effect transistor NM8 is connected to ground. The drain of the n-channel field-effect transistor NM9 is connected to the source of the p-channel field-effect transistor PM13. The gate of the n-channel field-effect transistor NM9 is connected to the gate of the n-channel field-effect transistor NM8. The source of the n-channel field-effect transistor NM9 is connected to ground. The drain of the n-channel field-effect transistor NM10 is connected to the drain of the p-channel field-effect transistor PM12. The gate of the n-channel field-effect transistor NM10 is connected to the drain of the n-channel field-effect transistor NM8. The source of the n-channel field-effect transistor NM10 is connected to ground. The control current $I_{ec}$ is output through a current path that branches from a current path connecting the drain of the n-channel field-effect transistor NM10 and the drain of the p-channel field-effect transistor PM12.

When the currents flowing through the n-channel field-effect transistors NM9 and NM10 are represented by I9 and I10, respectively, the currents I9 and I10 are proportional to the current supplied from the constant current source J2. When the current flowing through the n-channel field-effect transistor NM7 is represented by I7, the current I7 is proportional to the current $I_{in-s1}$. When the currents flowing through the p-channel field-effect transistors PM11 and PM12 are represented by I11 and I12, respectively, the current I12 is proportional to the current I11. The current I11 is equal to the sum of the current I9 and the current $I_{in-s1}$. The current I12 is equal to the sum of the current I7, the current I10, and the control current $I_{ec}$. In this way, the output circuit 55 has a function of generating the control current $I_{ec}$ on the basis of the current $I_{in-s1}$ and outputting the control current $I_{ec}$.

According to the first embodiment, the current source 50 can limit the control current $I_{ec}$, which is supplied to the collectors of the emitter follower transistors Tr31, Tr32, and Tr33, to not greater than the upper limit. Thus, the increase in collector current caused by thermal runaway of the transistors Tr21, Tr22, and Tr23 can be prevented or reduced. Since the control IC 40 further includes the current source 60 that supplies the constant current $I_{eb}$ to the bases of the emitter follower transistors Tr31, Tr32, and Tr33, the increase in collector current caused by thermal runaway of the transistors Tr21, Tr22, and Tr23 can be effectively prevented or reduced. Furthermore, scaling combining of the temperature-independent current $I_{in}$ and the temperature-dependent current $I_t$ having a one-dimensional change characteristic enables compensation for a change in the control current $I_{ec}$ with temperature. Moreover, the outputs from the amplifiers 21, 22, and 23 are appropriately limited through the limitation of the control current $I_{ec}$, which enables avoidance of a power drop due to leakage of current from a field-effect transistor in the antenna switch 90.

Figure 12:
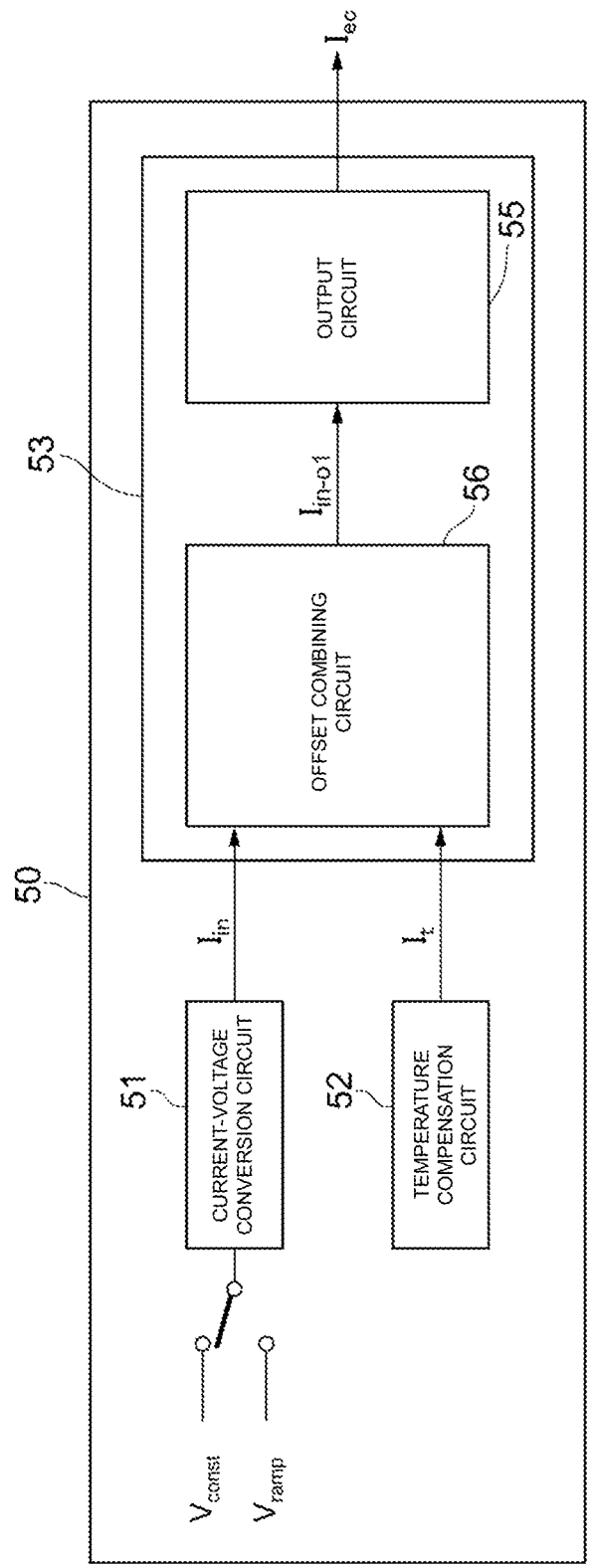
FIG. 12 is a circuit diagram of a current source according to a second embodiment of the present disclosure.

FIG. 12 is a circuit diagram of a current source 50 according to a second embodiment. Unlike the combining circuit 53 in the current source 50 according to the first embodiment, a combining circuit 53 in the current source 50 according to the second embodiment includes an offset combining circuit 56 instead of the scaling combining circuit 54 according to the first embodiment. The offset combining circuit 56 generates a current $I_{in-o1}$ which is obtained through offset combining, from the temperature-independent current $I_{in}$ and the temperature-dependent current $I_t$. The output circuit 55 generates the control current $I_{ec}$ on the basis of the current $I_{in-o1}$ and outputs the control current $I_{ec}$. The temperature-dependent current $I_t$ has a one-dimensional change characteristic.

Figure 13:
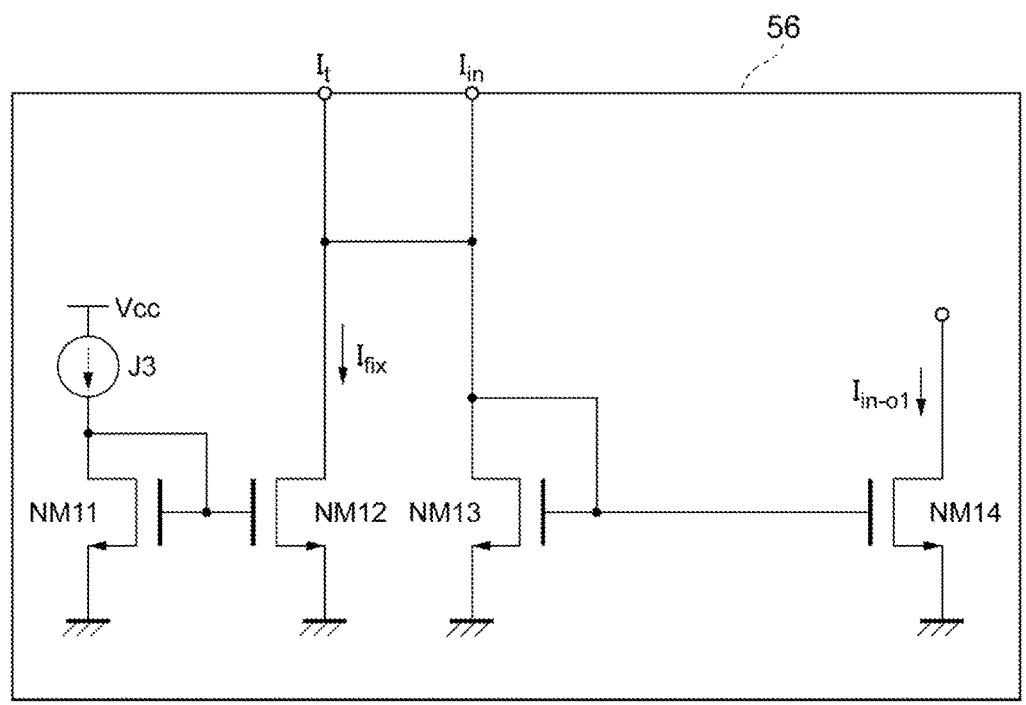
FIG. 13 is a circuit diagram of an offset combining circuit according to the second embodiment of the present disclosure.

FIG. 13 is a circuit diagram of the offset combining circuit 56 according to the second embodiment. Since the output circuit 55 according to the second embodiment has a circuit configuration similar to the circuit configuration of the output circuit 55 according to the first embodiment, the circuit configuration of the offset combining circuit 56 will be described. The offset combining circuit 56 includes a constant current source J3 and n-channel field-effect transistors NM11, NM12, NM13, and NM14. A constant current is supplied to the drain of the n-channel field-effect transistor NM11 from the constant current source J3 connected to the power supply voltage Vcc. The source of the n-channel field-effect transistor NM11 is connected to ground. The gate of the n-channel field-effect transistor NM11 is connected to the gate of the n-channel field-effect transistor NM12. The drain of the n-channel field-effect transistor NM11 is connected to the gate of the n-channel field-effect transistor NM11. The drains of the n-channel field-effect transistors NM12 and NM13 are interconnected, and the temperature-dependent current $I_t$ and the temperature-independent current $I_{in}$ are supplied to nodes between the drains of the n-channel field-effect transistors NM12 and NM13. The respective sources of the n-channel field-effect transistors NM12 and NM13 are connected to ground. The gate of the n-channel field-effect transistor NM13 is connected to the drain of the n-channel field-effect transistor NM13. The gate of the n-channel field-effect transistor NM14 is connected to the gate of the n-channel field-effect transistor NM13. The source of the n-channel field-effect transistor NM14 is connected to ground.

Figure 14:
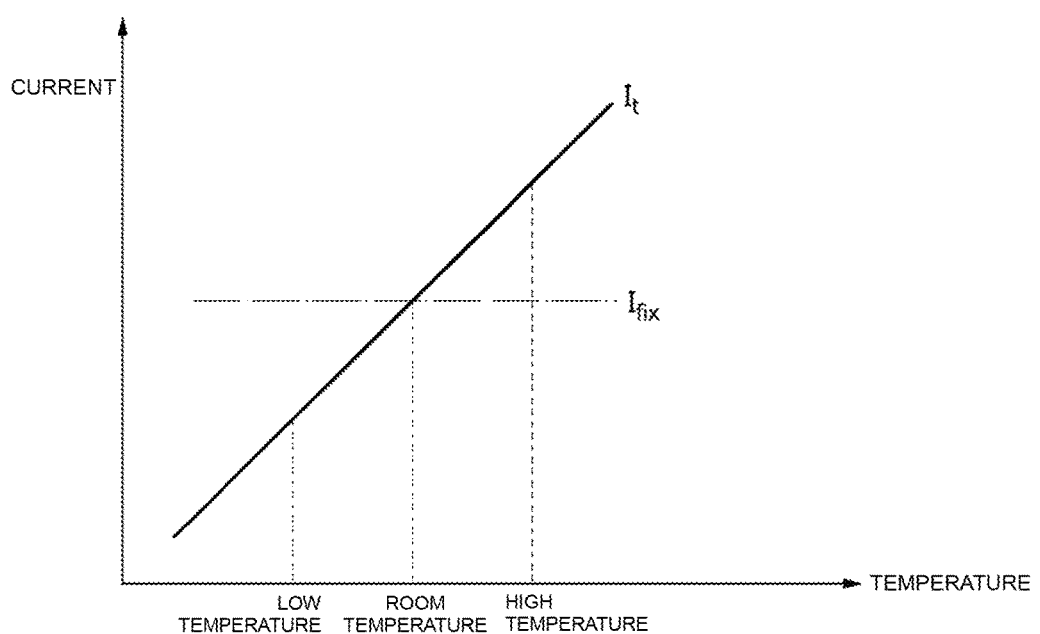
FIG. 14 is a graph depicting changes in a temperature-dependent current and a current with temperature according to the second embodiment of the present disclosure.
Figure 15:
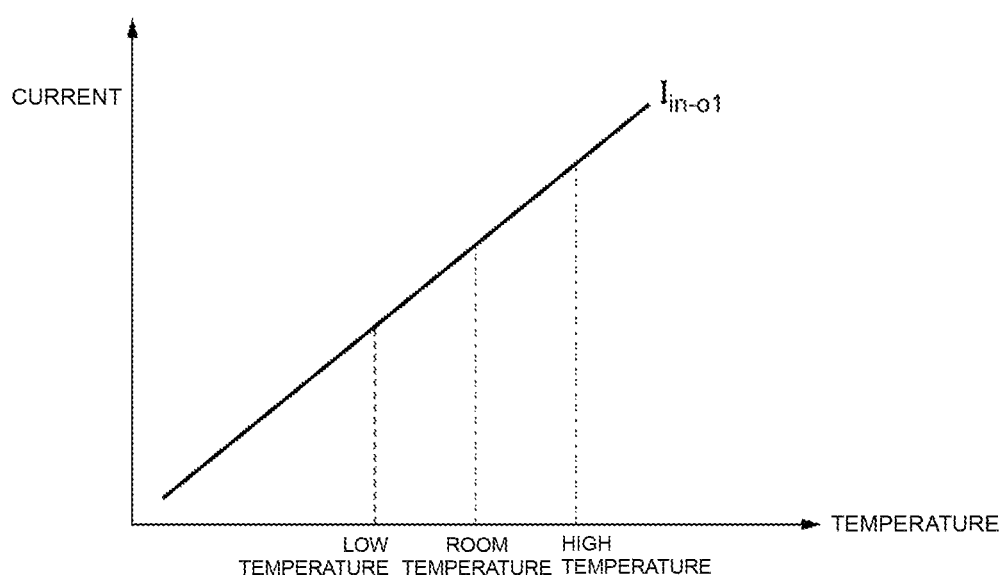
FIG. 15 is a graph depicting a change in current obtained through offset combining with temperature according to the second embodiment of the present disclosure.
Figure 16:
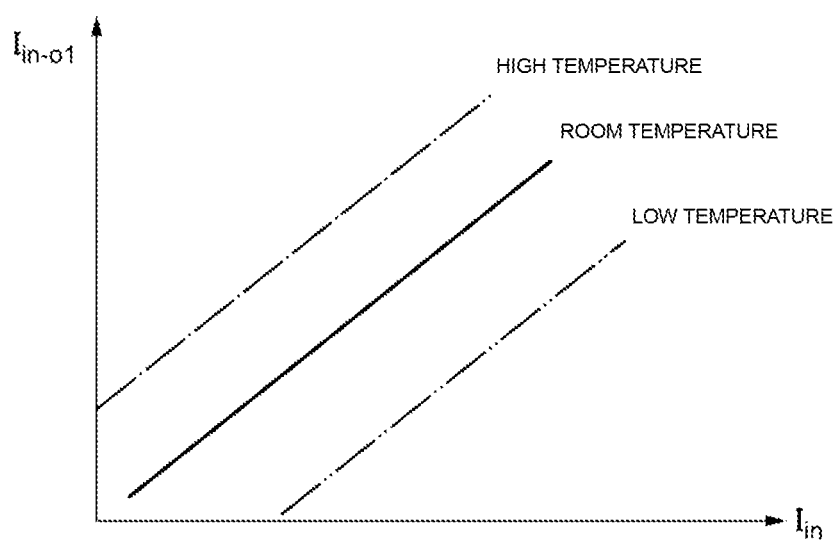
FIG. 16 is a graph depicting relationships between the current obtained through offset combining and a temperature-independent current according to the second embodiment of the present disclosure.

When the current flowing between the drain and source of the n-channel field-effect transistor NM12 is represented by $I_{fix}$, the current $I_{fix}$ is proportional to the constant current supplied from the constant current source J3 and is a fixed current having no temperature dependence (see FIG. 14). The temperature-dependent current $I_t$ and the current $I_{fix}$ are equal to each other at the room temperature. The temperature-dependent current $I_t$ is larger than the current $I_{fix}$ at temperatures higher than the room temperature, and the temperature-dependent current $I_t$ is smaller than the current $I_{fix}$ at temperatures lower than the room temperature. The current flowing between the drain and source of the n-channel field-effect transistor NM13 is given by $(I_{in}+I_t-I_{fix})$. The current $I_{in-o1}$ flowing between the drain and source of the n-channel field-effect transistor NM14 is proportional to $(I_{in}+I_t-I_{fix})$. In this way, the current $I_{in-o1}$ obtained through offset combining can be generated from the temperature-independent current $I_{in}$ and the temperature-dependent current $I_t$. The current $I_{in-o1}$ has a positive temperature characteristic in which the value of the current $I_{in-o1}$ increases with a temperature increase (see FIG. 15). Plotting the value of the temperature-independent current $I_{in}$ on the x-axis and the value of the current $I_{in-o1}$ on the y-axis of a graph yields lines as illustrated in FIG. 16. The lines on the graph at the room temperature, a low temperature, and a high temperature have substantially the same slopes. In offset combining, however, the correction value to be added to the value of the temperature-independent current $I_{in}$ increases as the temperature increases. When the correction value is referred to as a current correction value, the offset combining circuit 56 has a function of generating the current $I_{in-o1}$ by adding the current correction value corresponding to the temperature to the temperature-independent current $I_{in}$. The slopes of the lines on the graph illustrated in FIG. 16 represent the ratio of the current $I_{in-o1}$ to the temperature-independent current $I_{in}$.

According to the second embodiment, offset combining of the temperature-independent current $I_{in}$ and the temperature-dependent current $I_t$ having a one-dimensional change characteristic enables compensation for a change in the control current $I_{ec}$ with temperature.

Figure 17:
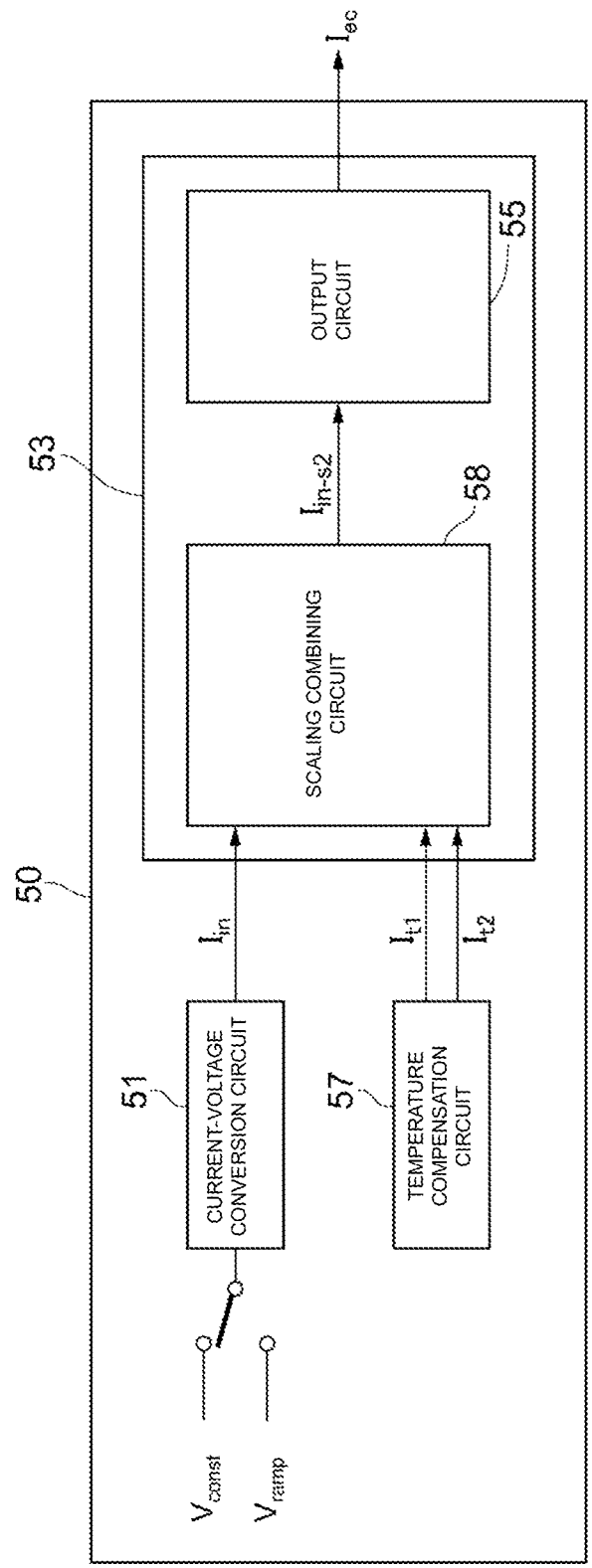
FIG. 17 is a circuit diagram of a current source according to a third embodiment of the present disclosure.

FIG. 17 is a circuit diagram of a current source 50 according to a third embodiment. Unlike the current source 50 according to the first embodiment, the current source 50 according to the third embodiment includes a temperature compensation circuit 57 instead of the temperature compensation circuit 52 according to the first embodiment. In addition, unlike the combining circuit 53 in the current source 50 according to the first embodiment, a combining circuit 53 in the current source 50 according to the third embodiment includes a scaling combining circuit 58 instead of the scaling combining circuit 54 of the first embodiment. The temperature compensation circuit 57 generates temperature-dependent currents $I_{t1}$ and $I_{t2}$ for compensating a change in the control current $I_{ec}$ with temperature. The scaling combining circuit 58 generates a current $I_{in-s2}$, which is obtained through scaling combining, from the temperature-independent current $I_{in}$ and the temperature-dependent currents $I_{t1}$ and $I_{t2}$. The output circuit 55 generates the control current $I_{ec}$ on the basis of the current $I_{in-s2}$ and outputs the control current $I_{ec}$.

Figure 18:
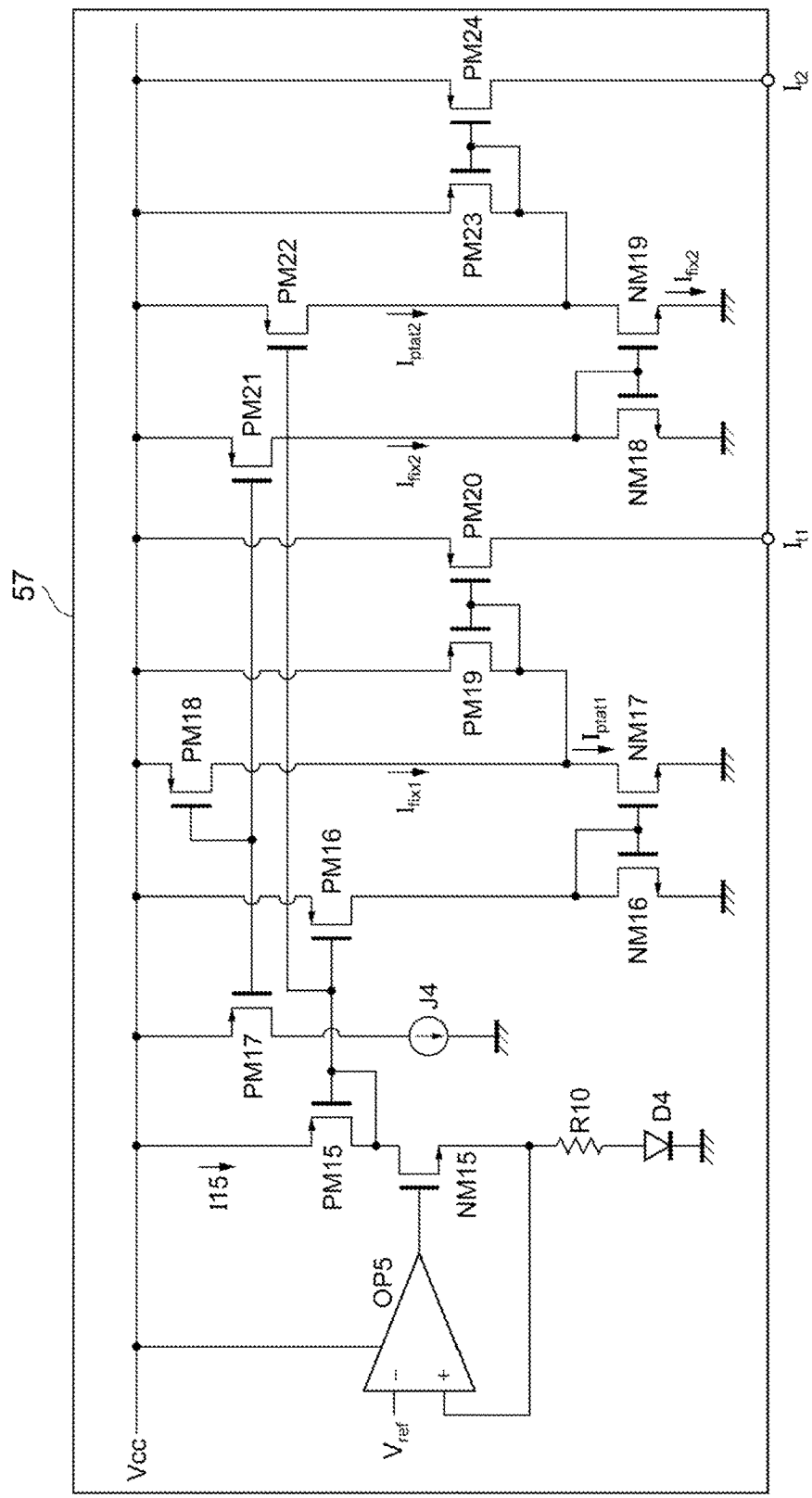
FIG. 18 is a circuit diagram of a temperature compensation circuit according to the third embodiment of the present disclosure.

FIG. 18 is a circuit diagram of the temperature compensation circuit 57 according to the third embodiment. The temperature compensation circuit 57 includes a constant current source J4, an operational amplifier OP5, n-channel field-effect transistors NM15, NM16, NM17, NM18, and NM19, p-channel field-effect transistors PM15, PM16, PM17, PM18, PM19, PM20, PM21, PM22, PM23, and PM24, a resistance element R10, and a diode D4. A fixed voltage $V_{ref}$ is supplied to a non-inverting input terminal of the operational amplifier OP5. An output terminal of the operational amplifier OP5 is connected to the gate of the n-channel field-effect transistor NM15. An inverting input terminal of the operational amplifier OP5 is connected to the source of the n-channel field-effect transistor NM15. The resistance element R10 and the diode D4 are connected in series between ground and a node between the source of the n-channel field-effect transistor NM15 and the inverting input terminal of the operational amplifier OP5. The source of the p-channel field-effect transistor PM15 is connected to the power supply voltage Vcc, and the drain of the p-channel field-effect transistor PM15 is connected to the drain of the n-channel field-effect transistor NM15. The gate of the p-channel field-effect transistor PM15 is connected to the drain of the p-channel field-effect transistor PM15.

The source of the p-channel field-effect transistor PM17 is connected to the power supply voltage Vcc. A constant current supplied from the constant current source J4 flows through the drain and source of the p-channel field-effect transistor PM17. The gate of the p-channel field-effect transistor PM17 is connected to the drain of the p-channel field-effect transistor PM17. The source of the p-channel field-effect transistor PM16 is connected to the power supply voltage Vcc. The gate of the p-channel field-effect transistor PM16 is connected to the gate of the p-channel field-effect transistor PM15. The drain of the p-channel field-effect transistor PM16 is connected to the drain of the n-channel field-effect transistor NM16. The source of the p-channel field-effect transistor PM18 is connected to the power supply voltage Vcc. The gate of the p-channel field-effect transistor PM18 is connected to the gate of the p-channel field-effect transistor PM17. The drain of the p-channel field-effect transistor PM18 is connected to the drain of the n-channel field-effect transistor NM17. The drain of the n-channel field-effect transistor NM16 is connected to the gate of the n-channel field-effect transistor NM16. The gate of the n-channel field-effect transistor NM16 is connected to the gate of the n-channel field-effect transistor NM17. The respective sources of the n-channel field-effect transistors NM16 and NM17 are connected to ground.

The source of the p-channel field-effect transistor PM19 is connected to the power supply voltage Vcc. The gate of the p-channel field-effect transistor PM19 is connected to the drain of the p-channel field-effect transistor PM19. The drain of the p-channel field-effect transistor PM19 is connected to the drain of the n-channel field-effect transistor NM17. The source of the p-channel field-effect transistor PM20 is connected to the power supply voltage Vcc. The gate of the p-channel field-effect transistor PM20 is connected to the gate of the p-channel field-effect transistor PM19.

The source of the p-channel field-effect transistor PM21 is connected to the power supply voltage Vcc. The gate of the p-channel field-effect transistor PM21 is connected to the gate of the p-channel field-effect transistor PM17. The drain of the p-channel field-effect transistor PM21 is connected to the drain of the n-channel field-effect transistor NM18. The source of the p-channel field-effect transistor PM22 is connected to the power supply voltage Vcc. The gate of the p-channel field-effect transistor PM22 is connected to the gate of the p-channel field-effect transistor PM16. The drain of the p-channel field-effect transistor PM22 is connected to the drain of the n-channel field-effect transistor NM19. The drain of the n-channel field-effect transistor NM18 is connected to the gate of the n-channel field-effect transistor NM18. The gate of the n-channel field-effect transistor NM18 is connected to the gate of the n-channel field-effect transistor NM19. The respective sources of the n-channel field-effect transistors NM18 and NM19 are connected to ground.

The source of the p-channel field-effect transistor PM23 is connected to the power supply voltage Vcc. The gate of the p-channel field-effect transistor PM23 is connected to the gate of the p-channel field-effect transistor PM24. The drain of the p-channel field-effect transistor PM23 is connected to the drain of the n-channel field-effect transistor NM19. The gate of the p-channel field-effect transistor PM23 is connected to the drain of the p-channel field-effect transistor PM23. The source of the p-channel field-effect transistor PM24 is connected to the power supply voltage Vcc.

The current flowing through the p-channel field-effect transistor PM15, the n-channel field-effect transistor NM15, the resistance element R10, and the diode D4 is represented by I15. The current I15 has a positive temperature characteristic in which the current I15 changes in accordance with the temperature characteristics of the diode D4. It is desirable that the diode D4 have substantially the same temperature characteristics as, for example, the diodes D311, D312, D321, D322, D331, and D332 illustrated in FIG. 1.

Figure 19:
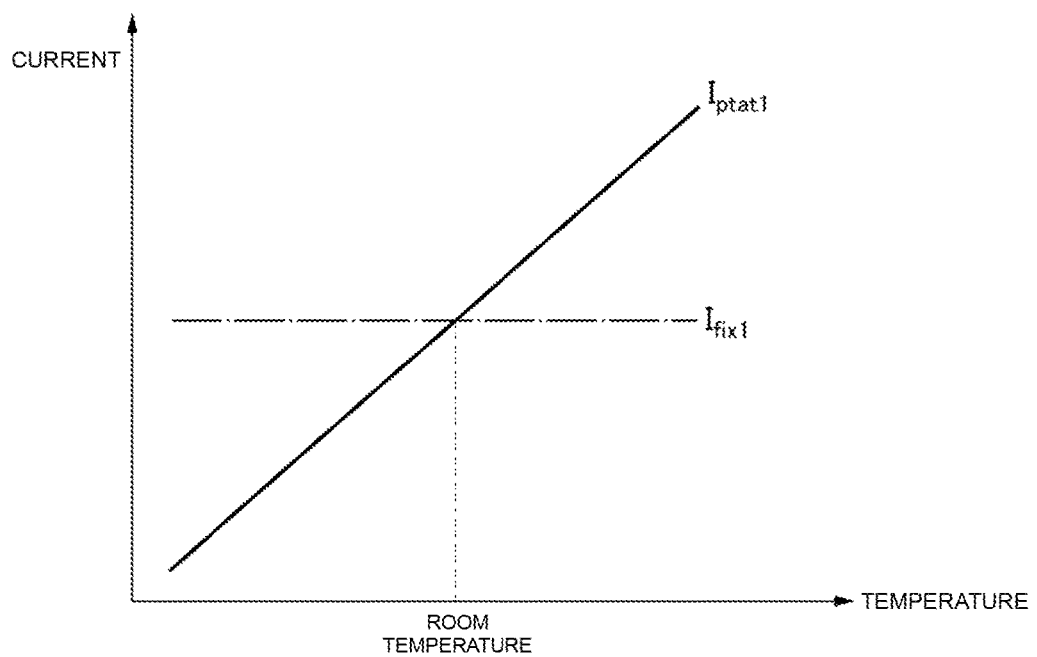
FIG. 19 is a graph depicting changes in currents with temperature according to the third embodiment of the present disclosure.
Figure 20:
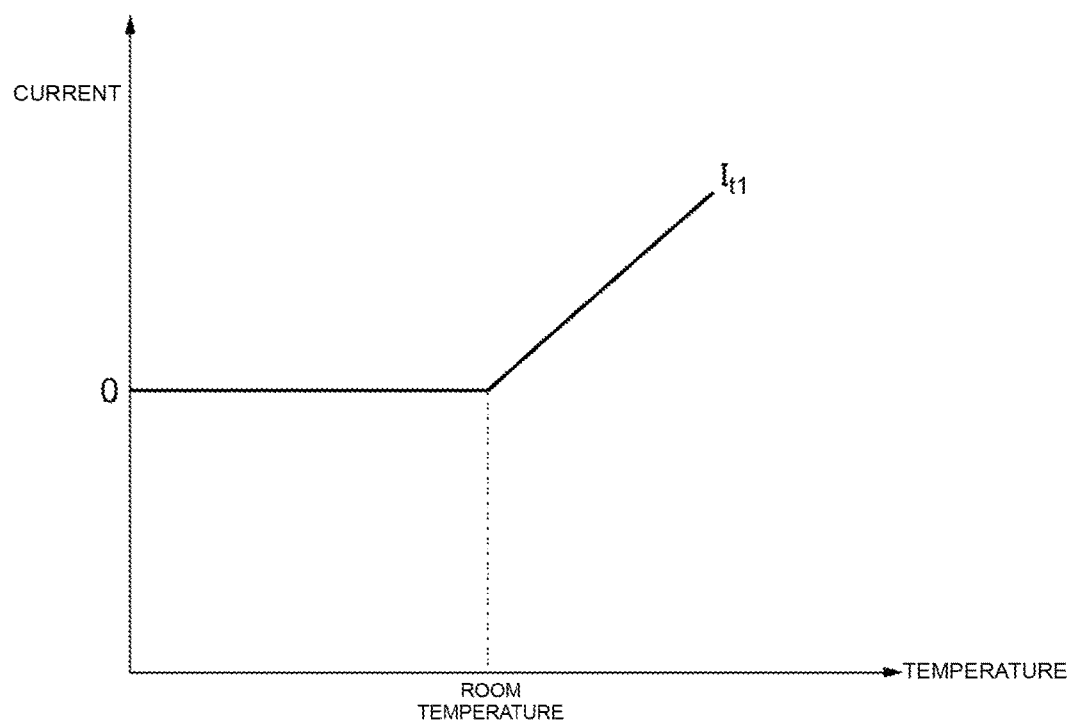
FIG. 20 is a graph depicting a change in temperature-dependent current with temperature according to the third embodiment of the present disclosure.

The current flowing between the drain and source of the n-channel field-effect transistor NM17 is represented by $I_{ptat1}$. Since the p-channel field-effect transistors PM15 and PM16 are connected in a current mirror configuration and the n-channel field-effect transistors NM16 and NM17 are connected in a current mirror configuration, the current $I_{ptat1}$ is proportional to the current I15. The current flowing between the drain and source of the p-channel field-effect transistor PM18 is represented by $I_{fix1}$. Since the p-channel field-effect transistors PM17 and PM18 are connected in a current mirror configuration, the current $I_{fix1}$ is proportional to the constant current supplied from the constant current source J4 and is a fixed current having no temperature dependence (see FIG. 19). The current $I_{ptat1}$ and the current $I_{fix1}$ are equal to each other at the room temperature. The current $I_{ptat1}$ is larger than the current $I_{fix1}$ at temperatures higher than the room temperature, and the current $I_{ptat1}$ is smaller than the current $I_{fix1}$ at temperatures lower than the room temperature. A current calculated by subtracting the current $I_{fix1}$ from the current $I_{ptat1}$ flows through the drain and source of the p-channel field-effect transistor PM19 at a temperature greater than or equal to the room temperature. The temperature-dependent current $I_{t1}$, which is proportional to the current flowing between the drain and source of the p-channel field-effect transistor PM19, flows between the drain and source of the p-channel field-effect transistor PM20. The temperature-dependent current $I_{t1}$ is a current having temperature dependence for compensating for a change in the control current $I_{ec}$ with temperature at a temperature greater than or equal to the room temperature (see FIG. 20).

Figure 21:
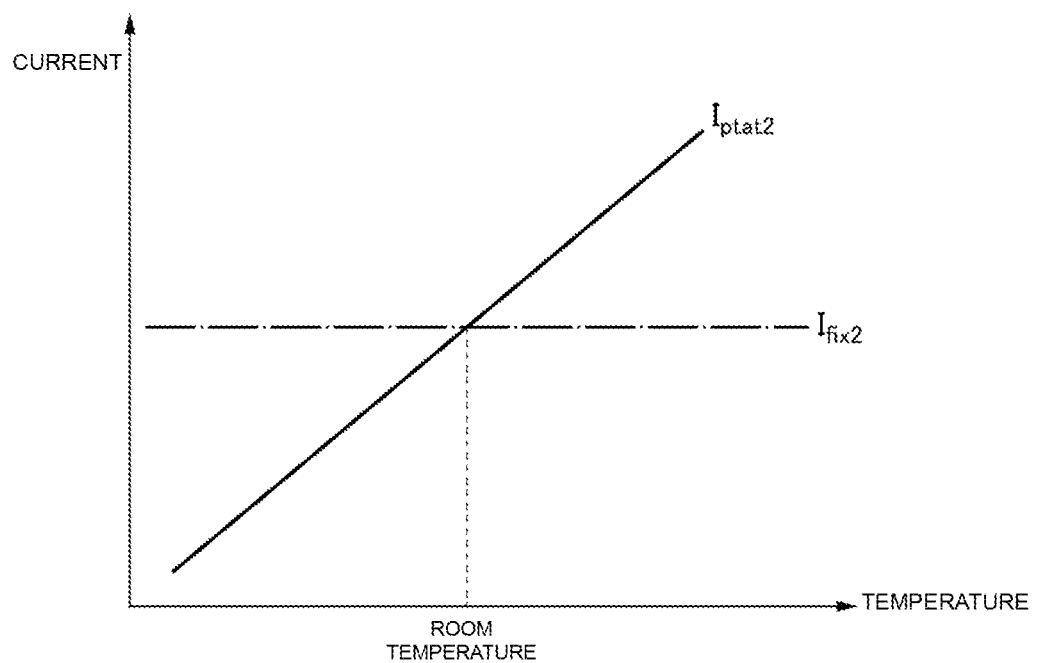
FIG. 21 is a graph depicting changes in currents with temperature according to the third embodiment of the present disclosure.
Figure 22:
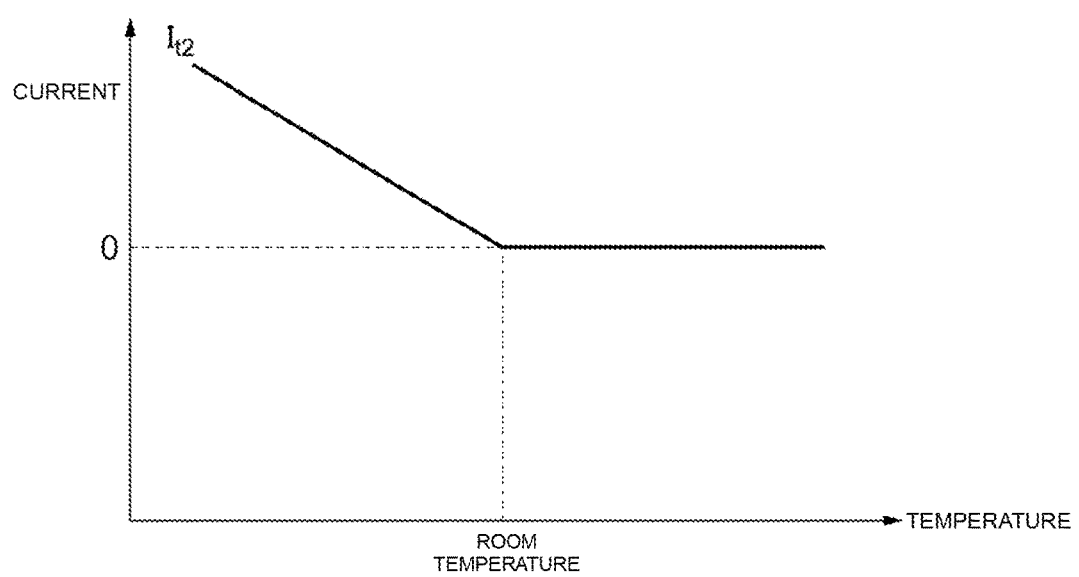
FIG. 22 is a graph depicting a change in temperature-dependent current with temperature according to the third embodiment of the present disclosure.

The current flowing between the drain and source of the p-channel field-effect transistor PM22 is represented by $I_{ptat2}$. Since the p-channel field-effect transistors PM15, PM16, and PM22 are connected in a current mirror configuration, the current $I_{ptat2}$ is proportional to the current I15. The current flowing between the drain and source of the p-channel field-effect transistor PM21 is represented by $I_{fix2}$. Since the p-channel field-effect transistors PM17 and PM21 are connected in a current mirror configuration, the current $I_{fix2}$ is proportional to the constant current supplied from the constant current source J4 and is a fixed current having no temperature dependence (see FIG. 21). The current $I_{ptat2}$ and the current $I_{fix2}$ are equal to each other at the room temperature. The current $I_{ptat2}$ is larger than the current $I_{fix2}$ at temperatures higher than the room temperature, and the current $I_{ptat2}$ is smaller than the current $I_{fix2}$ at temperatures lower than the room temperature. A current calculated by subtracting the current $I_{ptat2}$ from the current $I_{fix2}$ flows between the drain and source of the p-channel field-effect transistor PM23 at a temperature less than the room temperature. The temperature-dependent current $I_{t2}$, which is proportional to the current flowing between the drain and source of the p-channel field-effect transistor PM23, flows between the drain and source of the p-channel field-effect transistor PM24. The temperature-dependent current $I_{t2}$ is a current having temperature dependence for compensating for a change in the control current $I_{ec}$ with temperature at a temperature less than the room temperature (see FIG. 22).

Since the amount of change in the temperature-dependent current $I_{t1}$ with a temperature change at temperatures greater than or equal to the room temperature is different from the amount of change in the temperature-dependent current $I_{t2}$ with a temperature change at temperatures less than the room temperature, the temperature-dependent currents $I_{t1}$ and $I_{t2}$ have a two-dimensional change characteristic.

Figure 23:
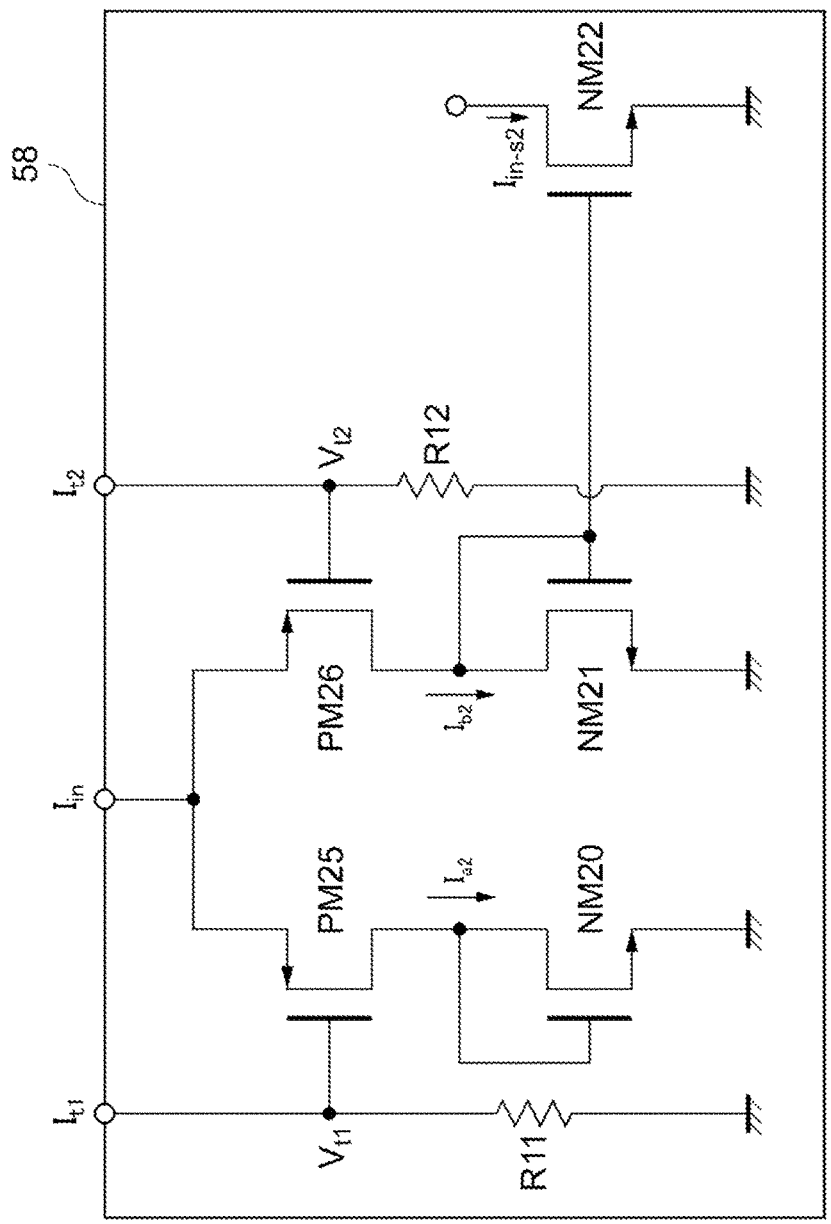
FIG. 23 is a circuit diagram of a scaling combining circuit according to the third embodiment of the present disclosure.

FIG. 23 is a circuit diagram of the scaling combining circuit 58 according to the third embodiment. Since the output circuit 55 according to the third embodiment has a circuit configuration similar to the circuit configuration of the output circuit 55 according to the first embodiment, the circuit configuration of the scaling combining circuit 58 will be described. The scaling combining circuit 58 includes n-channel field-effect transistors NM20, NM21, and NM22, p-channel field-effect transistors PM25 and PM26, and resistance elements R11 and R12. The respective sources of the p-channel field-effect transistors PM25 and PM26 are connected to each other, and the temperature-independent current $I_{in}$ is supplied to a node between the sources of the p-channel field-effect transistors PM25 and PM26. A voltage $V_{t1}$ is supplied to the gate of the p-channel field-effect transistor PM25. The voltage $V_{t1}$ is a temperature-dependent voltage equal to the voltage across the resistance element R11 through which the temperature-dependent current $I_{t1}$ flows. The drain of the p-channel field-effect transistor PM25 is connected to the drain of the n-channel field-effect transistor NM20. The gate of the n-channel field-effect transistor NM20 is connected to the drain of the n-channel field-effect transistor NM20, and the source of the n-channel field-effect transistor NM20 is connected to ground. A voltage $V_{t2}$ is supplied to the gate of the p-channel field-effect transistor PM26. The voltage $V_{t2}$ is a temperature-dependent voltage equal to the voltage across the resistance element R12 through which the temperature-dependent current $I_{t2}$ flows. The drain of the p-channel field-effect transistor PM26 is connected to the drain of the n-channel field-effect transistor NM21. The gate of the n-channel field-effect transistor NM21 is connected to the drain of the n-channel field-effect transistor NM21, and the source of the n-channel field-effect transistor NM21 is connected to ground. The n-channel field-effect transistors NM21 and NM22 are connected in a current mirror configuration.

Figure 24:
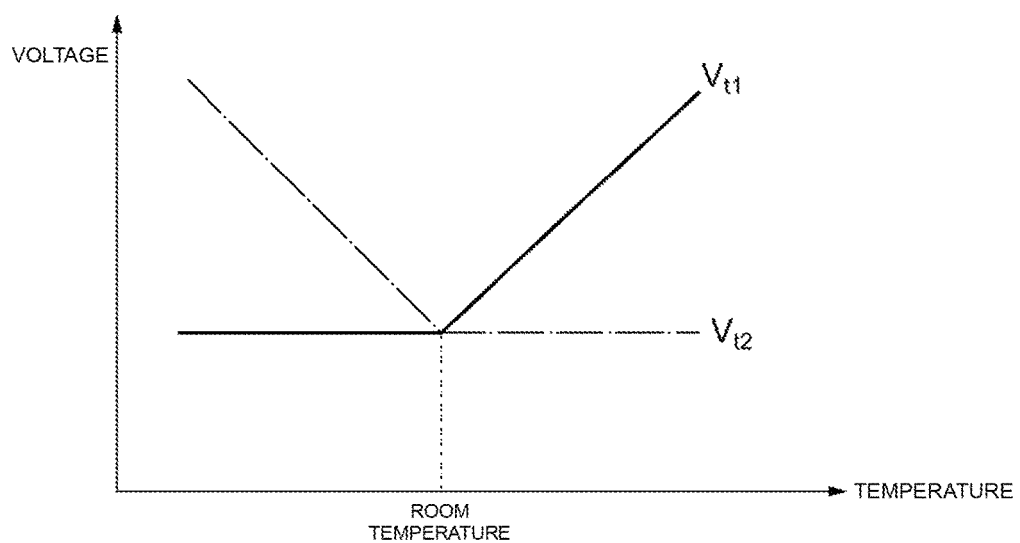
FIG. 24 is a graph depicting changes in temperature-dependent voltages with temperature according to the third embodiment of the present disclosure.
Figure 25:
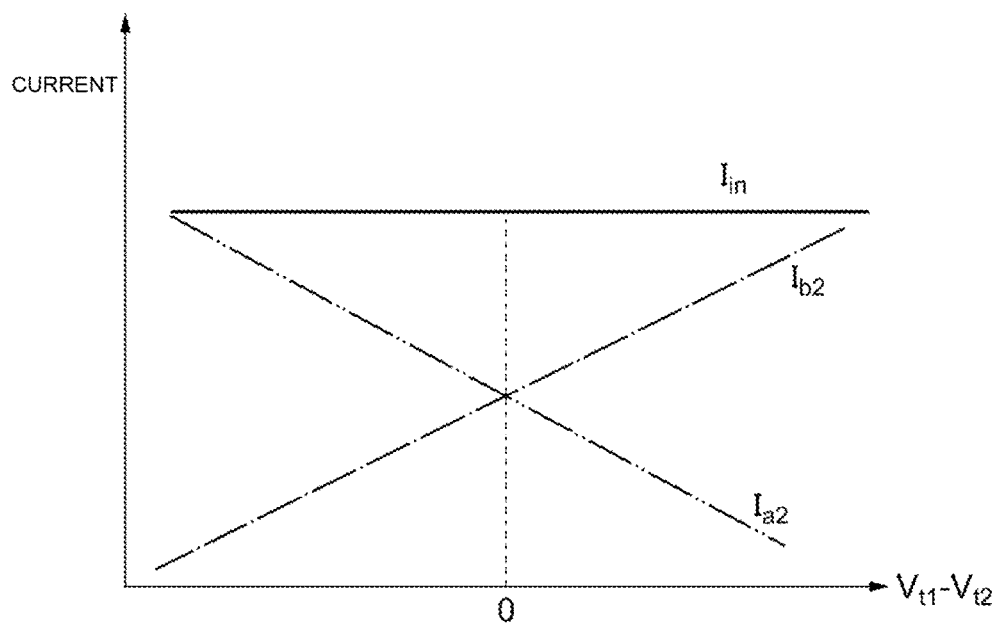
FIG. 25 is a graph depicting relationships between a current and a voltage difference according to the third embodiment of the present disclosure.
Figure 26:
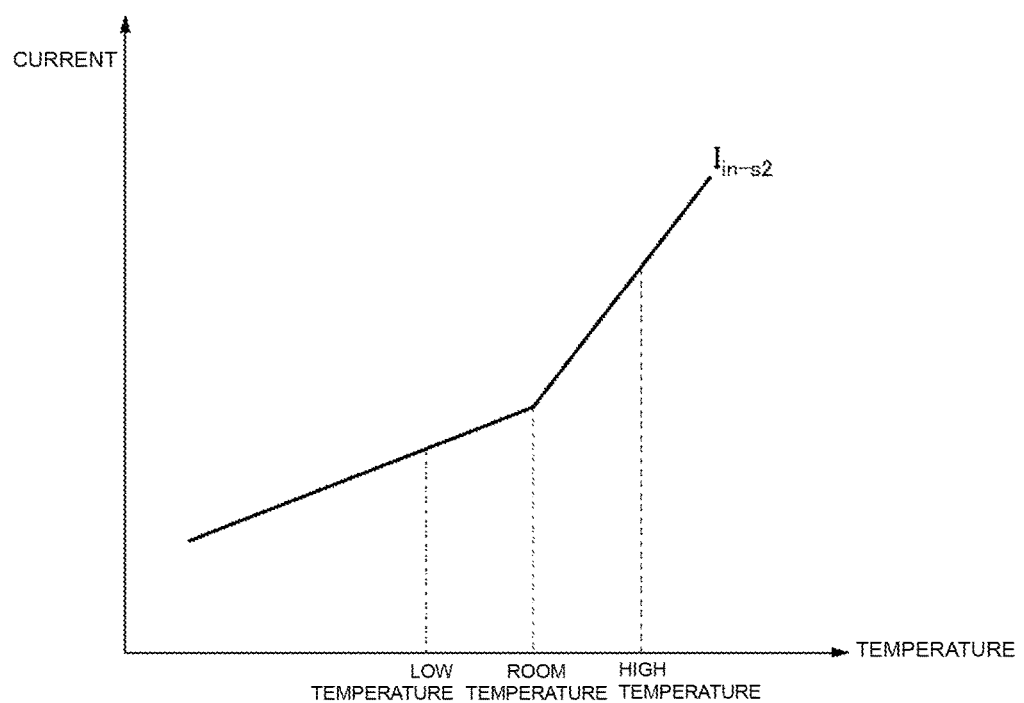
FIG. 26 is a graph depicting a change in current obtained through scaling combining with temperature according to the third embodiment of the present disclosure.
Figure 27:
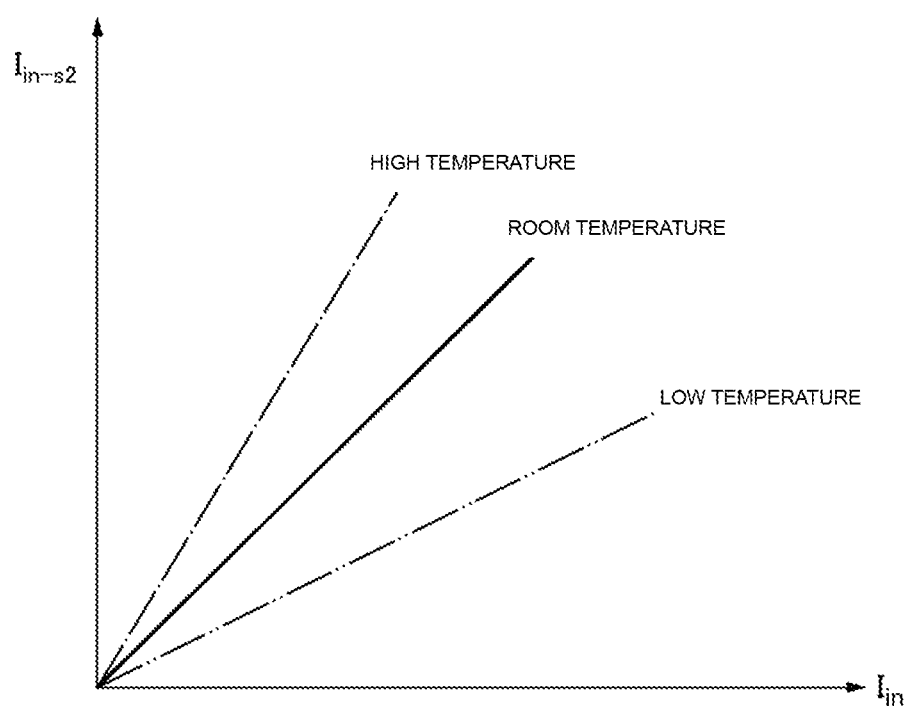
FIG. 27 is a graph depicting relationships between the current obtained through scaling combining and a temperature-independent current according to the third embodiment of the present disclosure.

At temperatures greater than or equal to the room temperature, the voltage $V_{t1}$ has a positive temperature characteristic in which the value of the voltage $V_{t1}$ increases with a temperature increase, and at temperatures less than the room temperature, the voltage $V_{t2}$ has a negative temperature characteristic in which the value of the voltage $V_{t2}$ decreases with a temperature increase (see FIG. 24). The voltage $V_{t1}$ and the voltage $V_{t2}$ are equal to each other at the room temperature. The voltage $V_{t2}$ has a value of zero at temperatures higher than the room temperature, and the voltage $V_{t1}$ has a value of zero at temperatures lower than the room temperature. The current flowing through the respective channels of the p-channel field-effect transistor PM25 and the n-channel field-effect transistor NM20 is represented by $I_{a2}$. The current flowing through the respective channels of the p-channel field-effect transistor PM26 and the n-channel field-effect transistor NM21 is represented by $I_{b2}$. In this case, the relationship $I_{in}=(I_{a2}+I_{b2})$ holds. The current $I_{b2}$ is proportional to the difference between the voltage $V_{t1}$ and the voltage $V_{t2}$ ($V_{t1}-V_{t2}$) (see FIG. 25). The current $I_{in-s2}$ flowing between the drain and source of the n-channel field-effect transistor NM22 is proportional to the current $I_{b2}$. In this way, the current $I_{in-s2}$ obtained through scaling combining can be generated from the temperature-independent current $I_{in}$ and the temperature-dependent currents $I_{t1}$ and $I_{t2}$. The current $I_{in-s2}$ has a positive temperature characteristic in which the value of the current $I_{in-s2}$ increases with a temperature increase, and has different temperature correction values for a temperature greater than or equal to the room temperature and for a temperature less than the room temperature (see FIG. 26). Plotting the value of the temperature-independent current $I_{in}$ on the x-axis and the value of the current $I_{in-s2}$ on the y-axis of a graph yields lines as illustrated in FIG. 27. The line on the graph at temperatures lower than the room temperature has a gentle slope, whereas the line on the graph at temperatures higher than the room temperature has a steep slope. In scaling combining, all the lines on the graph pass through the origin, and the slopes of the lines on the graph are controlled in accordance with temperature. The slopes of the lines on the graph illustrated in FIG. 27 represent the ratio of the current $I_{in-s2}$ to the temperature-independent current $I_{in}$. In scaling combining, in this way, the ratio of the current $I_{in-s2}$ to the temperature-independent current $I_{in}$ is adjusted in accordance with temperature. When the ratio of the current $I_{in-s2}$ to the temperature-independent current $I_{in}$ is referred to as a correction coefficient, the scaling combining circuit 58 has a function of generating the current $I_{in-s2}$ by multiplying the temperature-independent current $I_{in}$ by the correction coefficient corresponding to the temperature.

According to the third embodiment, scaling combining of the temperature-independent current $I_{in}$ and the temperature-dependent currents $I_{t1}$ and $I_{t2}$ having a two-dimensional change characteristic enables compensation for a change in the control current $I_{ec}$ with temperature.

Figure 28:
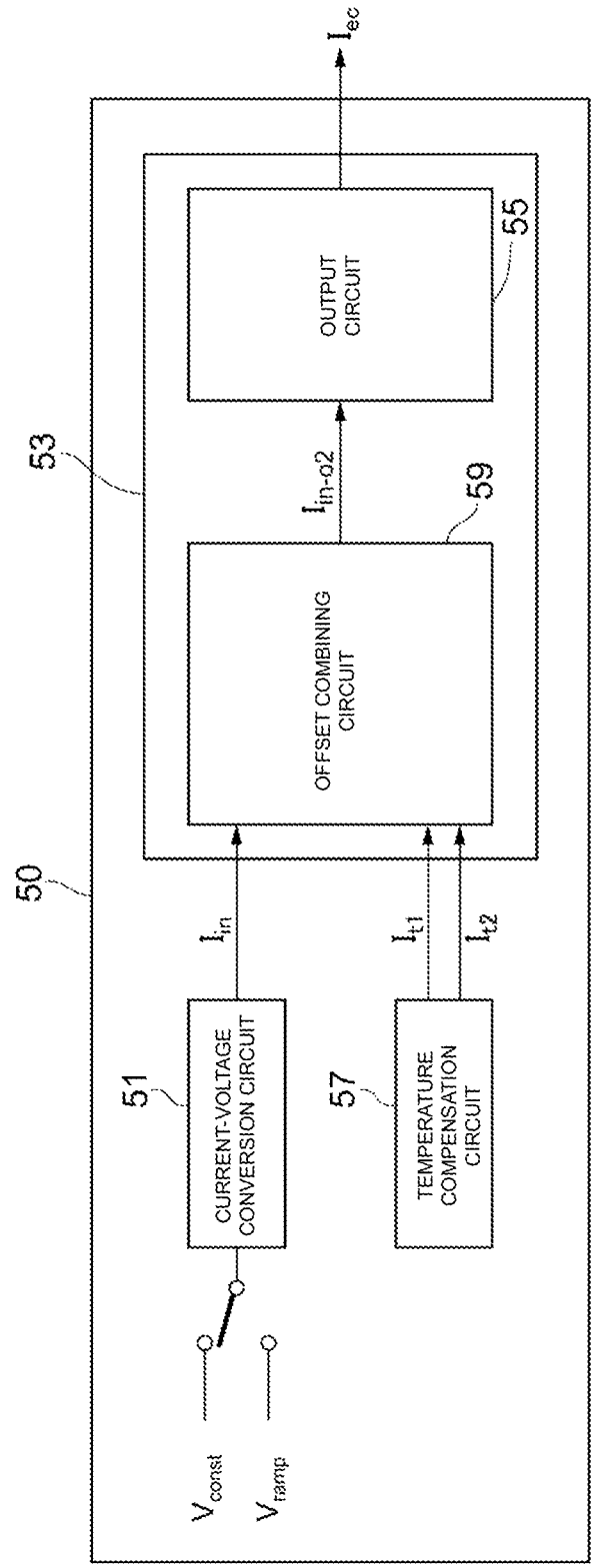
FIG. 28 is a circuit diagram of a current source according to a fourth embodiment of the present disclosure.

FIG. 28 is a circuit diagram of a current source 50 according to a fourth embodiment. Unlike the combining circuit 53 in the current source 50 according to the third embodiment, a combining circuit 53 in the current source 50 according to the fourth embodiment includes an offset combining circuit 59 instead of the scaling combining circuit 58 of the third embodiment. The offset combining circuit 59 generates a current $I_{in-c2}$, which is obtained through offset combining, from the temperature-independent current $I_{in}$ and the temperature-dependent currents $I_{t1}$ and $I_{t2}$. The output circuit 55 generates the control current $I_{ec}$ from the current $I_{in-o2}$ and outputs the control current $I_{ec}$. The temperature-dependent currents $I_{t1}$ and $I_{t2}$ have a two-dimensional change characteristic.

Figure 29:
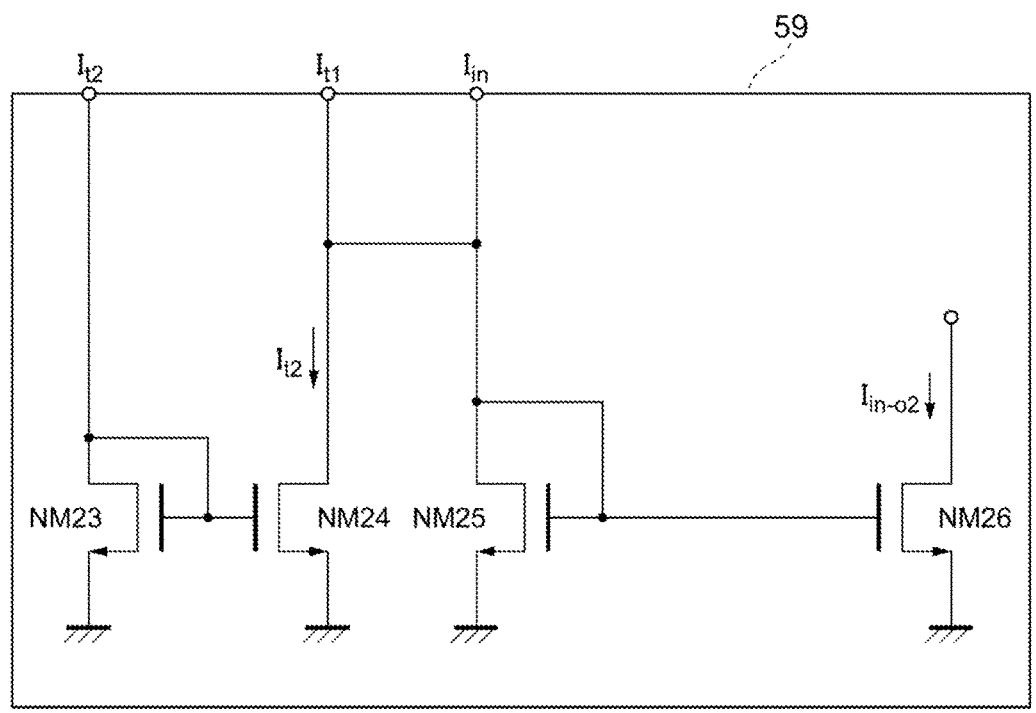
FIG. 29 is a circuit diagram of an offset combining circuit according to the fourth embodiment of the present disclosure.

FIG. 29 is a circuit diagram of the offset combining circuit 59 according to the fourth embodiment. Since the output circuit 55 according to the fourth embodiment has a circuit configuration similar to the circuit configuration of the output circuit 55 according to the first embodiment, the circuit configuration of the offset combining circuit 59 will be described. The offset combining circuit 59 includes n-channel field-effect transistors NM23, NM24, NM25, and NM26. The temperature-dependent current $I_{t2}$ is supplied to the drain of the n-channel field-effect transistor NM23. The drain of the n-channel field-effect transistor NM23 is connected to the gate of the n-channel field-effect transistor NM23. The gate of the n-channel field-effect transistor NM23 is connected to the gate of the n-channel field-effect transistor NM24. The source of the n-channel field-effect transistor NM23 is connected to ground. The drains of the n-channel field-effect transistors NM24 and NM25 are interconnected, and the temperature-dependent current $I_{t1}$ and the current $I_{in}$ are supplied to nodes between the drains of the n-channel field-effect transistors NM24 and NM25.

Figure 30:
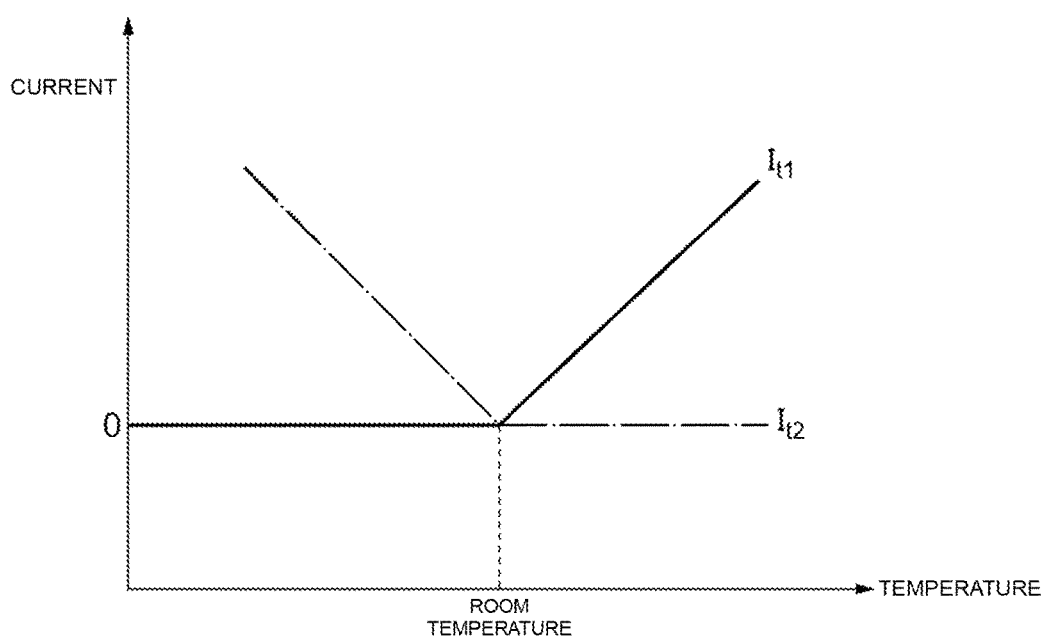
FIG. 30 is a graph depicting changes in temperature-dependent currents with temperature according to the fourth embodiment of the present disclosure.
Figure 31:
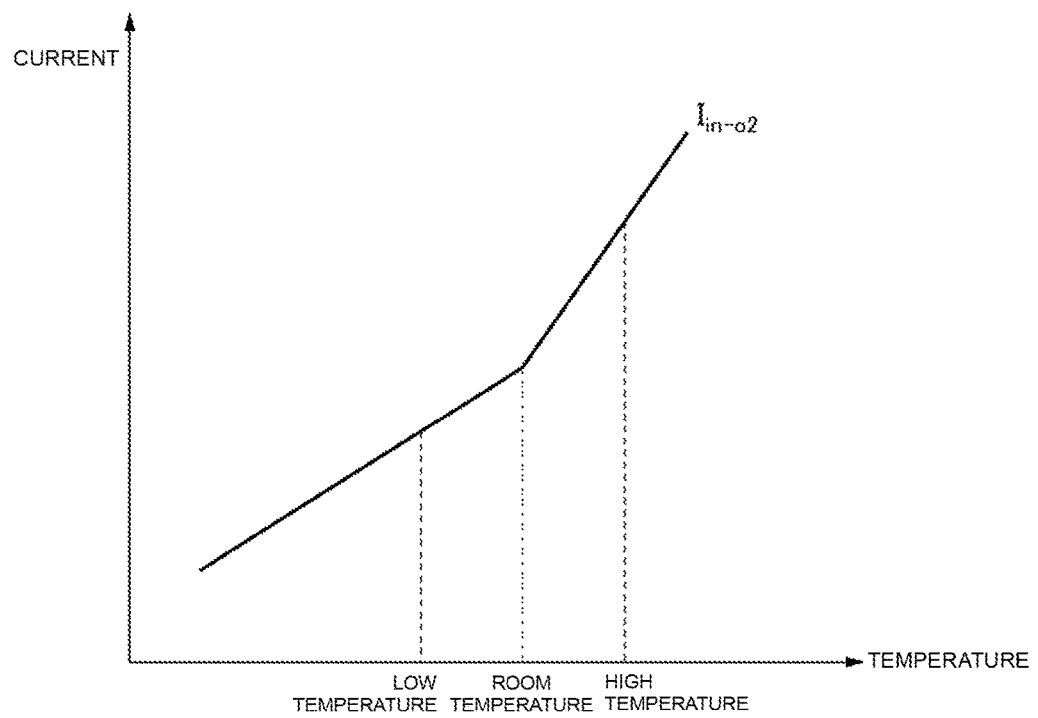
FIG. 31 is a graph depicting a change in current obtained through offset combining with temperature according to the fourth embodiment of the present disclosure.
Figure 32:
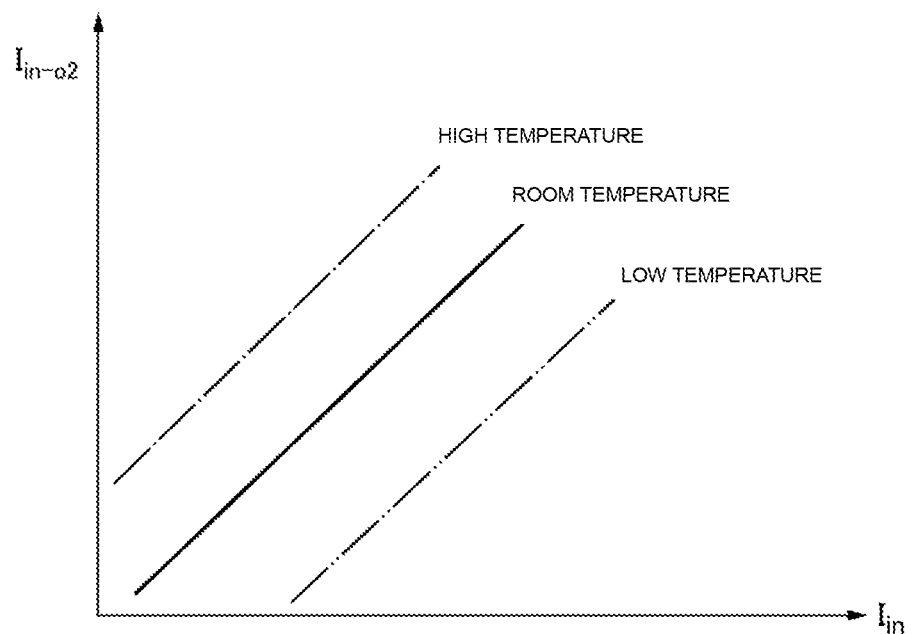
FIG. 32 is a graph depicting relationships between the current obtained through offset combining and a temperature-independent current according to the fourth embodiment of the present disclosure.

At temperatures greater than or equal to the room temperature, the temperature-dependent current $I_{t1}$ has a positive temperature characteristic in which the value of the current $I_{t1}$ increases with a temperature increase, and at temperatures less than the room temperature, the temperature-dependent current $I_{t2}$ has a negative temperature characteristic in which the value of the current $I_{t2}$ decreases with a temperature increase (see FIG. 30). The temperature-dependent current $I_{t1}$ and the temperature-dependent current $I_{t2}$ are equal to each other at the room temperature. The temperature-dependent current $I_{t2}$ has a value of zero at temperatures higher than the room temperature, and the temperature-dependent current $I_{t1}$ has a value of zero at temperatures lower than the room temperature. When the current mirror ratio of the n-channel field-effect transistors NM23 and NM24 connected in a current mirror configuration is set to 1:1, the current flowing between the drain and source of the n-channel field-effect transistor NM24 is $I_{t2}$. The current flowing between the drain and source of the n-channel field-effect transistor NM25 is given by $(I_{in}+I_{t1}-I_{t2})$. The current $I_{in\text{-}o2}$ flowing between the drain and source of the n-channel field-effect transistor NM26 is proportional to $(I_{in}+I_{t1}-I_{t2})$. In this way, the current $I_{in\text{-}o2}$ obtained through offset combining can be generated from the temperature-independent current $I_{in}$ and the temperature-dependent currents $I_{t1}$ and $I_{t2}$. The current $I_{in\text{-}o2}$ has a positive temperature characteristic in which the value of the current $I_{in\text{-}o2}$ increases with a temperature increase (see FIG. 31). Plotting the value of the temperature-independent current $I_{in}$ on the x-axis and the value of the current $I_{in\text{-}o2}$ on the y-axis of a graph yields lines as illustrated in FIG. 32. The lines on the graph at the room temperature, a low temperature, and a high temperature have substantially the same slopes. In offset combining, however, the correction value to be added to the value of the temperature-independent current $I_{in}$ increases as the temperature increases. When the correction value is referred to as a current correction value, the offset combining circuit 59 has a function of generating the current $I_{in\text{-}o2}$ by adding the current correction value corresponding to the temperature to the temperature-independent current $I_{in}$. The slopes of the lines on the graph illustrated in FIG. 32 represent the ratio of the current $I_{in\text{-}o2}$ to the temperature-independent current $I_{in}$.

According to the fourth embodiment, offset combining of the temperature-independent current $I_{in}$ and the temperature-dependent currents $I_{t1}$ and $I_{t2}$ having a two-dimensional change characteristic enables compensation for a change in the control current $I_{ec}$ with temperature.

The embodiments described above are intended to help easily understand the present invention and are not to be used to construe the present invention in a limiting fashion. Various modifications or improvements can be made to the present invention without departing from the gist of the present invention, and equivalents thereof are also included in the present invention. That is, the embodiments may be appropriately modified in design by those skilled in the art, and such modifications also fall within the scope of the present invention so long as the modifications include the features of the present invention. The circuit elements included in the embodiments and the arrangement and so on thereof are not limited to those described in the illustrated examples but can be modified as appropriate. The circuit elements included in the embodiments can be combined as much as technically possible, and such combinations of the circuit elements also fall within the scope of the present invention so long as the combinations of circuit elements include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier module comprising:
    an emitter follower transistor configured to supply a bias signal to an amplifier; and
    a first current source configured to:
        supply a control current to a collector of the emitter follower transistor,
        change the control current in accordance with a change in a control voltage of the first current source, and
        limit the control current to be less than or equal to an upper limit, the upper limit varying in accordance with the control voltage.

2. The power amplifier module according to claim 1, further comprising:
    a second current source configured to supply a constant current to a base of the emitter follower transistor.

3. The power amplifier module according to claim 2, wherein the control current and the constant current are controlled independently.

4. The power amplifier module according to claim 1, wherein the control voltage is selected to be one of a constant voltage and a ramp voltage.

5. The power amplifier module according to claim 1, wherein the first current source comprises:
    a voltage-current conversion circuit configured to convert the control voltage into a temperature-independent current,
    a temperature compensation circuit configured to generate a temperature-dependent current that compensates for a change in the control current due to a temperature, and
    a combining circuit that generates the control current based on the temperature-independent current and the temperature-dependent current.

6. The power amplifier module according to claim 1, wherein the first current source comprises:
    a voltage-current conversion circuit configured to convert the control voltage into a temperature-independent current,
    a temperature compensation circuit configured to:
        generate a first temperature-dependent current that compensates for a change in the control current due to temperatures equal to or greater than a room temperature, and
        generate a second temperature-dependent current that compensates for a change in the control current due to temperatures less than the room temperature, and
    a combining circuit that generates the control current based on the temperature-independent current and the temperature-dependent current.

7. The power amplifier module according to claim 4, wherein the first current source comprises:
    a voltage-current conversion circuit configured to convert the control voltage into a temperature-independent current,
    a temperature compensation circuit configured to generate a temperature-dependent current that compensates for a change in the control current due to a temperature, and
    a combining circuit that generates the control current based on the temperature-independent current and the temperature-dependent current.

8. The power amplifier module according to claim 7, wherein the first current source further comprises a switch configured to selectively connect one of the constant voltage and the ramp voltage to the voltage-current conversion circuit.

9. The power amplifier module according to claim 5, wherein the temperature-dependent current has a one-dimensional or a two-dimensional change characteristic.

10. The power amplifier module according to claim 5, wherein the combining circuit is configured to generate the control current by multiplying the temperature-independent current by a correction coefficient corresponding to the temperature.

11. The power amplifier module according to claim 6, wherein the combining circuit is configured to generate the control current by multiplying the first temperature-independent current and the second temperature-independent current by correction coefficients corresponding to the temperature.

12. The power amplifier module according to claim 8, wherein the combining circuit is configured to generate the control current by multiplying the temperature-independent current by a correction coefficient corresponding to the temperature.

13. The power amplifier module according to claim 9, wherein the combining circuit is configured to generate the control current by multiplying the temperature-independent current by a correction coefficient corresponding to the temperature.

14. The power amplifier module according to claim 5, wherein the combining circuit is configured to generate the control current by adding the temperature-independent current to a current correction value corresponding to the temperature.

15. The power amplifier module according to claim 6, wherein the combining circuit is configured to generate the control current by adding the first temperature-independent current and the second temperature-independent current to current correction values corresponding to the temperature.

16. The power amplifier module according to claim 8, wherein the combining circuit is configured to generate the control current by adding the temperature-independent current to a current correction value corresponding to the temperature.

17. The power amplifier module according to claim 9, wherein the combining circuit is configured to generate the control current by adding the temperature-independent current to a current correction value corresponding to the temperature.

18. The power amplifier module according to claim 1, further comprising:
an amplifier configured to amplify an input signal and output an amplified signal.

* * * * *

UNITED STATES PATENT AND TRADEMARK OFFICE
CERTIFICATE OF CORRECTION

PATENT NO. : 10,153,737 B2
APPLICATION NO. : 15/918414
DATED : December 11, 2018
INVENTOR(S) : Shota Ishihara et al.

It is certified that error appears in the above-identified patent and that said Letters Patent is hereby corrected as shown below:

In the Specification

Column 7, Line 32, "PMS" should be -- PM5 --.

Column 16, Line 22, "$I_{in-c2}$" should be -- $I_{in-o2}$ --.

Signed and Sealed this
Twelfth Day of March, 2019

Andrei Iancu
*Director of the United States Patent and Trademark Office*